(12) United States Patent
Kakamu et al.

(10) Patent No.: US 8,797,085 B2
(45) Date of Patent: Aug. 5, 2014

(54) LEVEL CONVERSION CIRCUIT AND SEMICONDUCTOR DEVICE

(75) Inventors: Tomoya Kakamu, Kasugai (JP); Hisao Suzuki, Kasugai (JP); Yuji Sekido, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/329,775

(22) Filed: Dec. 19, 2011

(65) Prior Publication Data

US 2012/0169383 A1 Jul. 5, 2012

(30) Foreign Application Priority Data

Jan. 5, 2011 (JP) ................................. 2011-000536

(51) Int. Cl.
*H03L 5/00* (2006.01)

(52) U.S. Cl.
USPC ......................................... 327/333; 327/108

(58) Field of Classification Search
USPC ............... 327/108, 333; 326/63, 80; 341/144, 341/146, 152; 365/189.11
See application file for complete search history.

(56) References Cited

U.S. PATENT DOCUMENTS

| | | | |
|---|---|---|---|
| 7,795,945 B2 | 9/2010 | Shimizu et al. | |
| 2003/0062939 A1 | 4/2003 | Tanaka et al. | |
| 2005/0231262 A1* | 10/2005 | Tahara et al. | ................. 327/333 |
| 2005/0243614 A1 | 11/2005 | Kang et al. | |
| 2008/0030253 A1 | 2/2008 | Chen et al. | |
| 2008/0144422 A1 | 6/2008 | Kang et al. | |
| 2009/0206904 A1 | 8/2009 | Shimura | |
| 2010/0045503 A1 | 2/2010 | Oba | |
| 2010/0117705 A1 | 5/2010 | Nomura | |
| 2011/0006827 A1 | 1/2011 | Shimura | |
| 2012/0169383 A1* | 7/2012 | Kakamu et al. | ................ 327/117 |
| 2012/0218016 A1 | 8/2012 | Nomura | |

FOREIGN PATENT DOCUMENTS

| | | |
|---|---|---|
| CN | 101655521 | 2/2010 |
| JP | 2003-078407 | 3/2003 |
| JP | 2006-216211 | 8/2006 |
| JP | 2009-200739 | 9/2009 |
| JP | 2009-213048 | 9/2009 |
| JP | 2010-118748 | 5/2010 |
| JP | 2010-263659 | 11/2010 |
| WO | WO-2007/135799 A1 | 11/2007 |

OTHER PUBLICATIONS

CNOA—Office Action of Chinese Patent Application No. 201110458338.8 dated Mar. 18, 2014 with Engiish translation.

* cited by examiner

*Primary Examiner* — Long Nguyen
(74) *Attorney, Agent, or Firm* — Fujitsu Patent Center

(57) ABSTRACT

A first conversion circuit converts a first clock signal based on a signal level of a first voltage into a second clock signal based on a signal level of a second voltage. A flip-flop circuit supplied with the first voltage as an operation voltage latches and outputs a signal, which is based on the signal level of the first voltage, in accordance with the first clock signal. A second conversion circuit supplied with the second voltage as an operation voltage converts a signal level of an input signal, which is based on an output signal of the flip-flop circuit, into the signal level of the second voltage in synchronization with the second clock signal.

20 Claims, 28 Drawing Sheets

US 8,797,085 B2

LEVEL CONVERSION CIRCUIT AND SEMICONDUCTOR DEVICE

CROSS-REFERENCE TO RELATED APPLICATIONS

This application is based upon and claims the benefit of priority from prior Japanese Patent Application No. 2011-000536, filed on Jan. 5, 2011, the entire contents of which are incorporated herein by reference.

FIELD

The present application relates to a level conversion circuit and a semiconductor device.

BACKGROUND

In a semiconductor integrated circuit device (Large Scale Integration: LSI) with multiple power supplies, a level shift circuit is provided to couple between circuits with different power supply voltages (refer to WO 2007/135799).

The level shift circuit is used for a digital-to-analog conversion circuit (DAC circuit) 10 illustrated in FIG. 1, for example. The DAC circuit 10 outputs an output current Io in accordance with a multiple-bit input signal DT.

The DAC circuit 10 includes flip-flop circuits 11. The flip-flop circuits 11 are provided in the number corresponding to the number of bits of the input signal DT. The flip-flop circuits 11 synchronize with a clock signal CK to latch the corresponding bit of the input signal DT, and output a signal at a level in accordance with the latched level. Conversion circuits (decoders) 12 decode output signals of the flip-flop circuits 11 to output the decoded signals. A first high potential voltage VDD in accordance with the level of the input signal DT is supplied to the flip-flop circuits 11 and the conversion circuits 12.

Level shift circuits 13 are supplied with the first high potential voltage VDD and a second high potential voltage AVD different therefrom. The second high potential voltage AVD is a voltage supplied to obtain the output current Io and is a voltage higher than the first high potential voltage VDD. The level shift circuits 13 are provided in the number corresponding to the number of bits of the output signals of the conversion circuits 12. Each of the level shift circuits 13 converts the level of a corresponding one-bit signal from the level of the first high potential voltage VDD to the level of the second high potential voltage AVD. Therefore, each level shift circuit 13 converts the level of the signal output from the corresponding conversion circuit 12 to a level in accordance with the second high potential voltage AVD to output the converted signal.

A level shift circuit 14 is supplied with the second high potential voltage AVD. The level shift circuit 14 converts the level of the clock signal CK from the level of the first high potential voltage VDD to the level of the second high potential voltage AVD to output a converted clock signal ACK.

Flip-flop circuits 15 are provided in the number corresponding to the number of bits of the output signals of the level shift circuits 13. Each flip-flop circuit 15 is formed by transistors having a high withstanding voltage characteristic to operate at the second high potential voltage AVD. Each flip-flop circuit 15 synchronizes with the clock signal ACK output from the level shift circuit 14 to latch the output signal of the corresponding level shift circuit 13, and outputs a signal in accordance with the latched level. The input timing of a bit into each flip-flop circuit 15 depends on a delay in a signal path through the conversion circuit 12 and the level shift circuit 13. The flip-flop circuits 15 are provided to cause the timings of bits varying due to differential delays between the signal paths to conform to each other.

Driver circuits 16 operate at the second high potential voltage AVD, and generate driving signals in accordance with the output signals of the flip-flop circuits 15. A current conversion circuit (expressed as "current DAC") 17 includes a plurality of current sources and drives these current sources in accordance with the driving signals. The current conversion circuit 17 then combines currents of the current sources to generate the output current Io.

The DAC circuit 10 as in the above includes a plurality of flip-flop circuits formed by transistors having a high withstanding voltage characteristic. A transistor having a high withstanding voltage characteristic requires a large footprint. Therefore, the level shift circuit occupies a large area and brings an increase in the area of a semiconductor integrated circuit.

SUMMARY

According to one aspect, a level conversion circuit includes a first conversion circuit that converts a first clock signal based on a signal level of a first voltage into a second clock signal based on a signal level of a second voltage. A flip-flop circuit supplied with the first voltage as an operation voltage latches and outputs a signal, which is based on the signal level of the first voltage, in accordance with the first clock signal. A second conversion circuit supplied with the second voltage as an operation voltage converts a signal level of an input signal, which is based on an output signal of the flip-flop circuit, into the signal level of the second voltage in synchronization with the second clock signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

The embodiments of a level conversion circuit will be described with reference to the drawings.

Figure 3:
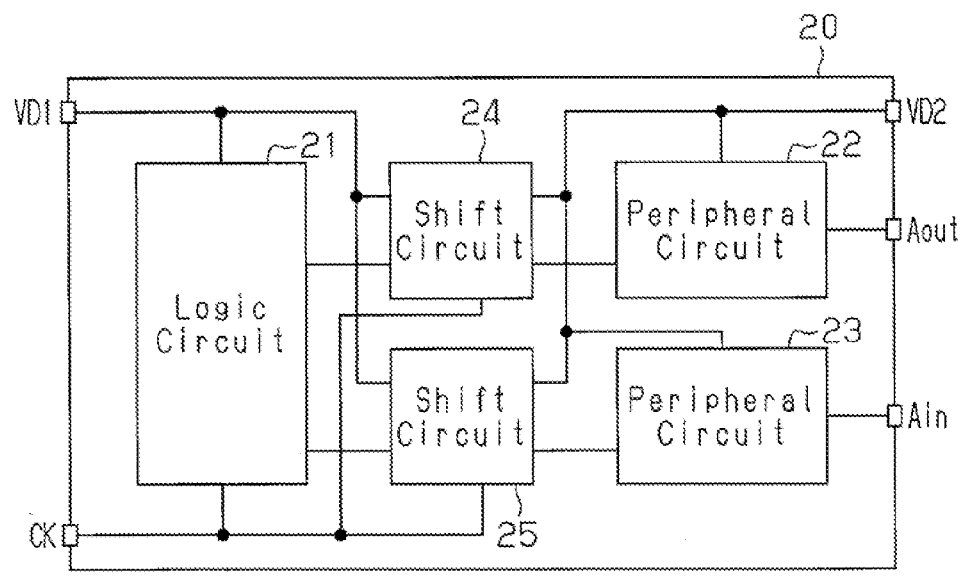
FIG. 3 is a block diagram of a semiconductor integrated circuit.

As illustrated in FIG. 3, a semiconductor integrated circuit (LSI) 20 includes a logic circuit 21 (power domain) that operates at a first high potential voltage VD1 and peripheral circuits 22 and 23 (power domain) that operate at a second high potential voltage VD2.

The logic circuit 21 is, for example, a circuit that handles digital signals such as image data and moving image data. The peripheral circuits 22 and 23 are, for example, analog circuits that handle analog signals such as audio signals. The peripheral circuit 22 is, for example, a digital-to-analog conversion circuit (DAC circuit) that converts a digital signal into an analog signal. The peripheral circuit 23 is, for example, an analog-to-digital conversion circuit (ADC circuit) that converts an analog signal into a digital signal.

The logic circuit 21 outputs a multiple-bit signal to a level shift circuit 24. The level shift circuit 24 includes a plurality of level shifters corresponding to the number of bits of a signal. A clock signal CK is supplied to the level shift circuit 24. For example, in the level shift circuit 24, the clock signal CK is supplied to a circuit part with which the logic circuit 21 operates in synchronization. The level shift circuit 24 operates in synchronization with the clock signal CK and converts a signal at the level of the first high potential voltage VD1 into a signal at the level of the second high potential voltage VD2. The level shift circuit 24 operates in synchronization with the clock signal CK to agree with the timings of the multiple-bit signal. The peripheral circuit 22 outputs an analog signal Aout in response to output signals of the level shift circuit 24.

The peripheral circuit 23 converts a supplied analog signal Ain into a multiple-bit digital signal. A level shift circuit 25 includes a plurality of level shifters corresponding to the number of bits of the digital signal. The level shift circuit 25 is supplied with the clock signal CK. The level shift circuit 25 operates in synchronization with the clock signal CK and converts a signal at the level of the second high potential voltage VD2 into a signal at the level of the first high potential voltage VD1. The level shift circuit 25 operates in synchronization with the clock signal CK to agree with the timings of the multiple-bit signal. The logic circuit 21 receives output signals of the level shift circuit 25.

The structure of the logic circuit 21 is not particularly limited as long as the logic circuit 21 operates at the first high potential voltage VD1. Further, as long as the peripheral circuits 22 and 23 operate at the second high potential voltage VD2, they are not limited to analog circuits. For example, the peripheral circuit 22 may be an interface circuit in between with an external circuit.

Further, in FIG. 3, the peripheral circuit 22 is coupled to the level shift circuit 24 but may be formed in a manner that the peripheral circuit 22 includes the level shift circuit 24. Similarly, the peripheral circuit 23 is coupled to the level shift circuit 25 but may be formed in a manner that the peripheral circuit 23 includes the level shift circuit 25.

The embodiments of a digital-to-analog conversion circuit will be described as an example of a peripheral circuit including a level shift circuit. In the following description, the same reference numerals are given to the same elements, and all or a part of the descriptions of the elements will be omitted.

First Embodiment

Figure 2:
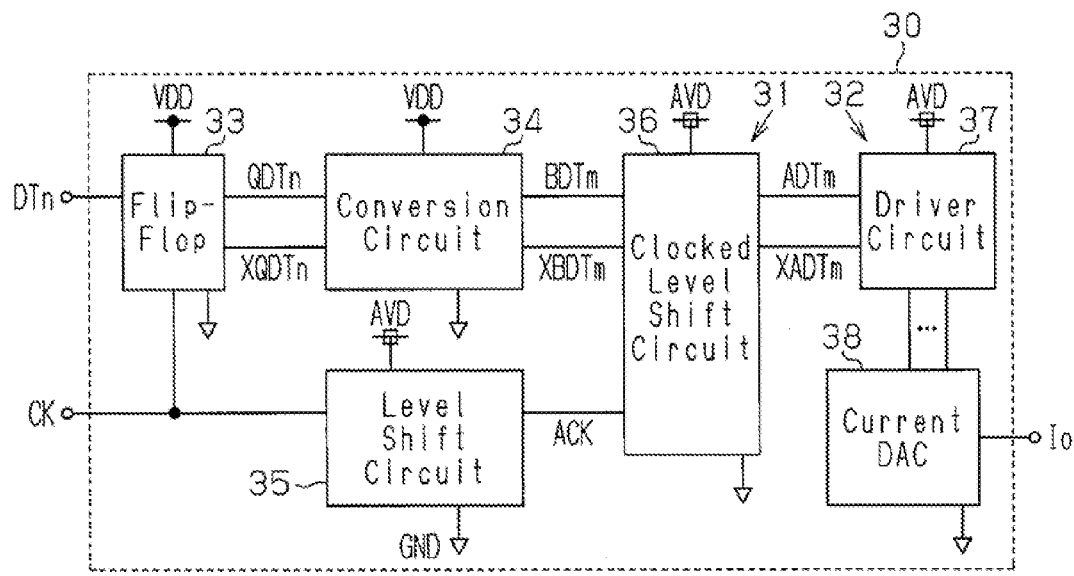
FIG. 2 is a block circuit diagram of a D/A conversion circuit of a first embodiment.

As illustrated in FIG. 2, a digital-to-analog conversion circuit (DAC circuit) 30 includes a level shift circuit (level conversion circuit) 31 and an analog circuit 32. The level shift circuit 31 converts an input signal at the level of a first high potential voltage VDD into a signal at the level of a second high potential voltage AVD. The analog circuit 32 generates an analog signal in accordance with an output signal of the level shift circuit 31.

The level shift circuit 31 includes a flip-flop circuit (hereinafter FF circuit) 33 to which a digital signal DTn is supplied. The FF circuit 33 is supplied with the first high potential voltage VDD corresponding to the level of the signal DTn. Further, the FF circuit 33 is supplied with a low potential voltage (ground GND, for example). The signal DTn represents one of a plurality (n bits) of signals DT1 to DTn. In FIG. 2, the index "n" of the signal DTn indicates the bit number. In the following description, a signal including multiple bits may be illustrated by adding to a signal name a reference numeral to which the bit number is added.

The FF circuit 33 latches the signal DTn in synchronization with the clock signal CK, and outputs a signal QDTn having the latched level and an inverted signal XQDTn having a level at which the latched level is logically inverted. Namely, the FF circuit 33 operates in synchronization with the clock signal CK and outputs complementary signals QDTn and XQDTn in accordance with the signal DTn.

A conversion circuit 34 receives the complementary signals QDTn and XQDTn. The conversion circuit 34 is supplied with the first high potential voltage VDD and the low potential voltage. The conversion circuit 34 is, for example, a decoder. The conversion circuit 34 generates m-bit complementary signals BDTm and XBDTm from the n-bit complementary signals QDTn and XQDTn. The number of bits, n, of the signals QDTn and XQDTn and the number of bits, m, of the signals BDTm and XBDTm may be the similar value in accordance with the structure of the conversion circuit 34.

A level shift circuit 35 receives the clock signal CK. The level shift circuit 35 is supplied with the second high potential voltage AVD and the low potential voltage. The level shift circuit 35 converts the level of the clock signal CK into the level of the second high potential voltage AVD and outputs the converted clock signal ACK.

A clocked level shift circuit (hereinafter CLS circuit) 36 is supplied with the complementary signals BDTm and XBDTm, which are output from the conversion circuit 34, and the clock signal ACK output from the level shift circuit 35. The CLS circuit 36 is supplied with the second high potential voltage AVD and the low potential voltage. The CLS circuit 36 receives the complementary signals BDTm and XBDTm in synchronization with the clock signal ACK, and converts the level of the received signal into the level of the second high potential voltage AVD. The CLS circuit 36 then latches the converted signal and outputs complementary signals ADTm and XADTm in accordance with the latched level.

An analog circuit 32 includes a driver circuit 37. The driver circuit 37 is supplied with the second high potential voltage AVD and the low potential voltage. The driver circuit 37 receives the complementary signals ADTm and XADTm, which are output from the CLS circuit 36, and generates driving signals in accordance with the complementary signals ADTm and XADTm. A current conversion circuit (expressed as "current DAC") 38 is supplied with the second high potential voltage AVD and the low potential voltage. The current conversion circuit 38 includes a plurality of current sources, and drives the current sources in accordance with the driving signals output from the driver circuit 37. The current conversion circuit 38 then combines currents of the current sources to generate an output current Io.

Figure 4:
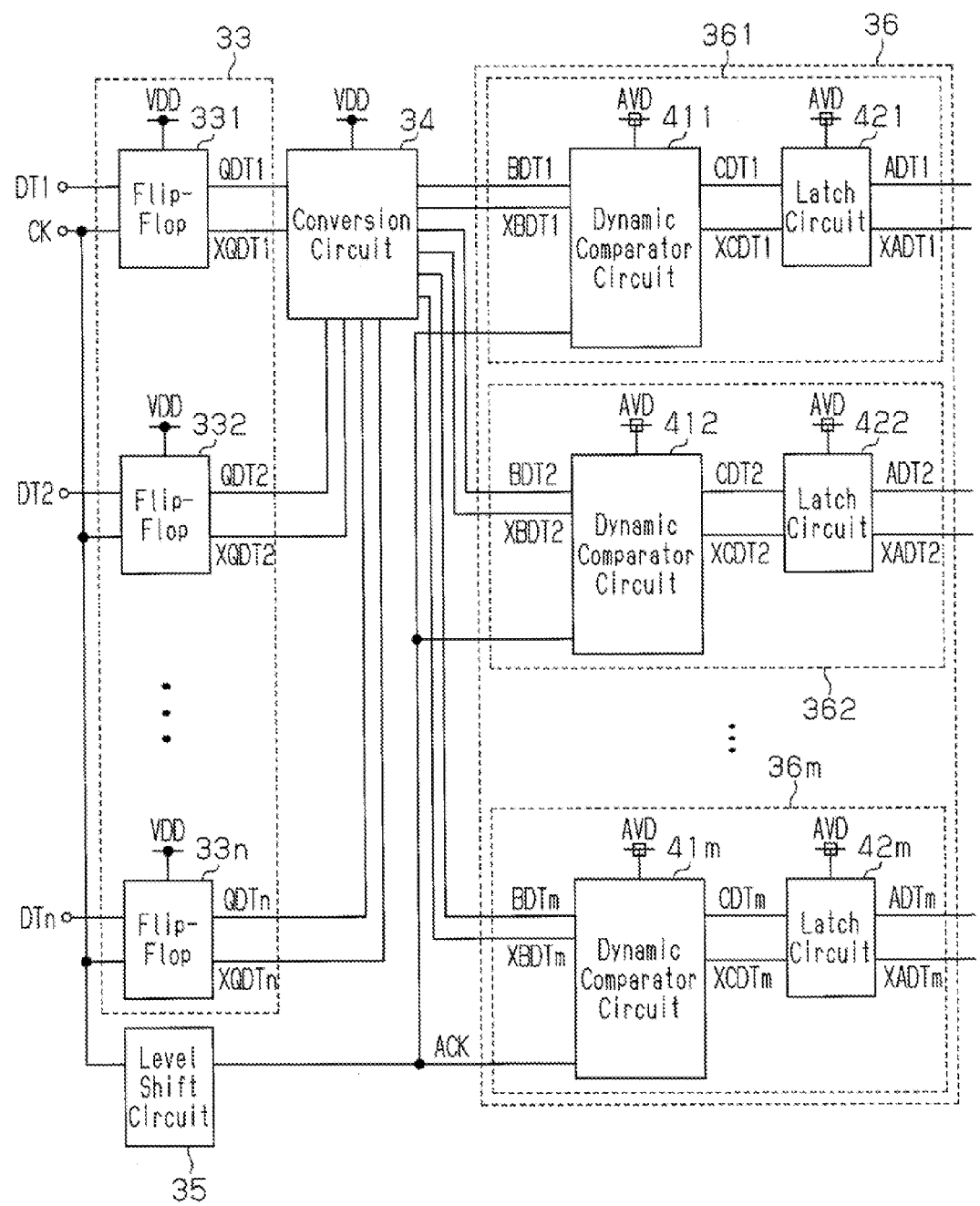
FIG. 4 is a block circuit diagram of a level shift circuit.

As illustrated in FIG. 4, the FF circuit 33 includes n number of FF circuits 331 to 33n corresponding to the number of bits of the signal DTn. The FF circuits 331 to 33n are low voltage FF circuits that operate at the first high potential voltage VDD. Each of the FF circuits 331 to 33n is formed by transistors having a low voltage characteristic. The FF circuits 331 to 33n are D-type FF circuits, for example.

The FF circuits 331 to 33n include data input terminals that receive the signals DT1 to DTn, respectively, and clock input terminals that receive the clock signal CK. The FF circuit 331 latches the signal DT1 in synchronization with the clock signal CK and outputs the signal QDT1 having the latched level and the signal XQDT1 having the level at which the latched level is logically inverted. In other words, the FF circuit 331 latches the signal DT1 in synchronization with the clock signal CK, and outputs the complementary signals QDT1 and XQDT1 based on the latched level. Similarly, the FF circuits 332 to 33n latch the signals DT2 to DTn in synchronization with the clock signal CK, and output the complementary signals QDT2 and XQDT2 to QDTn and XQDTn, respectively.

The CLS circuit 36 includes m number of CLS circuits 361 to 36m that respectively receive complementary signals BDT1 and XBDT1 to BDTm and XBDTm, which are output from the conversion circuit 34.

The CLS circuit 361 includes a dynamic comparator circuit (hereinafter DC circuit) 411 and a latch circuit 421. The DC circuit 411 is supplied with the complementary signals BDT1 and XBDT1 and the clock signal ACK. The DC circuit 411 operates in synchronization with the clock signal ACK and converts the complementary signals BDT1 and XBDT1 into complementary signals CDT1 and XCDT1 in accordance with the level of the second high potential voltage AVD. The latch circuit 421 latches the complementary signals CDT1 and XCDT1, and outputs the complementary signals ADT1 and XADT1 in accordance with their respective latched levels.

Figure 5:
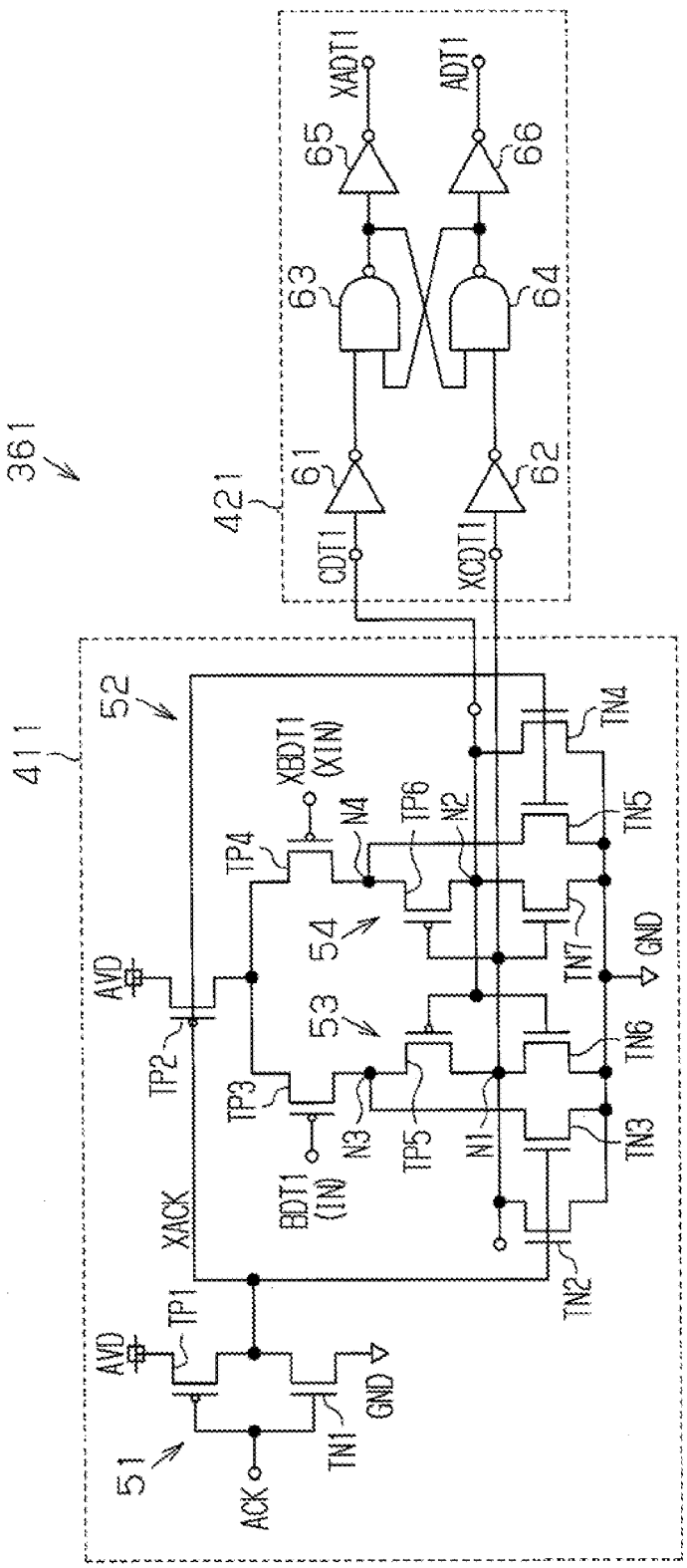
FIG. 5 is a circuit diagram of a clocked level shift circuit.

As illustrated in FIG. 5, the clock signal ACK is supplied to a gate of a P-channel MOS transistor TP1 and a gate of an N-channel MOS transistor TN1. The second high potential voltage AVD is supplied to a source of the transistor TP1. A drain of the transistor TP1 is coupled to a drain of the transistor TN1. The low potential voltage GND is supplied to a source of the transistor TN1. The transistors TP1 and TN1 operate as an inverter circuit 51 using the second high potential voltage AVD and the low potential voltage GND as power supply voltages. The inverter circuit 51 logically inverts the level of the clock signal ACK to generate an inverted clock signal XACK. The inverted clock signal XACK is supplied to a converter 52.

The converter 52 includes P-channel MOS transistors TP2 to TP6 and N-channel MOS transistors TN2 to TN7. The inverted clock signal XACK is supplied to a gate of the P-channel MOS transistor TP2 and gates of the N-channel MOS transistors TN2 to TN5.

The second high potential voltage AVD is supplied to a source of the transistor TP2. A drain of the transistor TP2 is coupled to sources of the P-channel MOS transistors TP3 and TP4. The signal BDT1 (input signal IN) is supplied to a gate of the transistor TP3, and the inverted signal XBTD1 (inverted signal XIN) is supplied to a gate of the transistor TP4.

A drain of the transistor TP3 is coupled to a source of the P-channel MOS transistor TP5. A drain of the transistor TP5 is coupled to a drain of the N-channel MOS transistor TN6. The low potential voltage GND is supplied to a source of the transistor TN6. Gates of the transistors TP5 and TN6 are mutually coupled. Therefore, the transistors TP5 and TN6 operate as an inverter circuit 53 using a source voltage of the transistor TP3 and the low potential voltage GND as operation voltages.

A drain of the transistor TP4 is coupled to a source of the P-channel MOS transistor TP6. A drain of the transistor TP6 is coupled to a drain of the N-channel MOS transistor TN7. The low potential voltage GND is supplied to a source of the transistor TN7. Gates of the transistors TP6 and TN7 are mutually coupled. Therefore, the transistors TP6 and TN7 operate as an inverter circuit 54 using a source voltage of the transistor TP4 and the low potential voltage GND as operation voltages.

The low potential voltage GND is supplied to sources of the transistors TN2, TN3, TN4 and TN5. A drain of the transistor TN2 is coupled to a node N1 between the drains of the transistors TP5 and TN6. The node N1 functions as an output terminal of the inverter circuit 53. Further, the node N1 is coupled to a node between the gates of the transistors TP6 and TN7, that is, an input terminal of the inverter circuit 54.

A drain of the transistor TN4 is coupled to a node N2 between drains of the transistors TP6 and TN7. The node N2 functions as an output terminal of the inverter circuit 54. Further, the node N2 is coupled to a node between the gates of the transistors TP5 and TN6, that is, an input terminal of the inverter circuit 53.

A drain of the transistor TN3 is coupled to a node N3 between the drain of the transistor TP3 and the source of the transistor TP5. The node N3 functions as a power supply terminal on the high potential side of the inverter circuit 53. A drain of the transistor TN5 is coupled to a node N4 between the drain of the transistor TP4 and the source of the transistor TP6. The node N4 functions as a power supply terminal on the high potential side of the inverter circuit 54.

The latch circuit 421 includes inverter circuits 61 and 62 that receive the complementary signals CDT1 and XCDT1, respectively, from the DC circuit 411 (converter 52). An output terminal of the inverter circuit 61 is coupled to a first input terminal of a NAND circuit 63, and a second input terminal of the NAND circuit 63 is coupled to an output terminal of a NAND circuit 64. An output terminal of the inverter circuit 62 is coupled to a first input terminal of the NAND circuit 64, and a second input terminal of the NAND circuit 64 is coupled to an output terminal of the NAND circuit 63. Further, the output terminal of the NAND circuit 63 is coupled to an input terminal of an inverter circuit 65, and the output terminal of the NAND circuit 64 is coupled to an input terminal of an inverter circuit 66. The inverter circuit 65 then outputs the inverted signal XADT1, and the inverter circuit 66 outputs the signal ADT1. The circuits 61 to 66 included in the latch circuit 421 are supplied with the second high potential voltage AVD and the low potential voltage GND as two types of operation voltages.

The operation of the clocked level shift circuit (CLS circuit) 361 configured as above will be described.

In the following description, the level of the low potential voltage GND is referred to as the "L level", the level of the first high potential voltage VDD as the "H1 level" and the level of the second high potential voltage AVD as the "H2 level".

When the clock signal ACK is at the L level, the inverter circuit 51 outputs the inverted clock signal XACK at the H2 level. The transistor TP2 is inactivated in response to the inverted clock signal XACK at the H2 level. Thus, the sources of the transistors TP3 and TP4 that receive the input signals BDT1 and XBDT1 respectively become a floating state. The transistors TN2 to TN5 are activated in response to the inverted clock signal XACK at the H2 level. At this time, the transistor TN2, which has been activated, sets a potential at the node N1 to the L level. Similarly, the transistors TN3, TN4 and TN5, which have been activated, set potentials at the nodes N3, N2 and N4 to the L level, respectively. As a result, the output signals CDT1 and XCDT1 are set to the L level. This state is called a reset state. Further, a period during which the clock signal ACK is at the L level is called a reset period.

Next, when the clock signal ACK changes from the L level to the H2 level, the inverter circuit 51 outputs the inverted clock signal XACK at the L level in response to the clock signal ACK at the H2 level. The transistor TP2 is activated in response to the inverted clock signal XACK at the L level. The transistor TP2, which has been activated, supplies the second high potential voltage AVD to the sources of the transistors TP3 and TP4 that receive the input signals BDT1 and XBDT1, respectively.

The transistors TN2 to TN5 are inactivated in response to the inverted clock signal XACK at the L level. In this state, the transistors TP5 and TN6 operate as the inverter circuit 53 using the source voltage of the transistor TP3 and the low potential voltage GND as operation voltages. Further, the transistors TP6 and TN7 operate as the inverter circuit 54 using the source voltage of the transistor TP4 and the low potential voltage GND as operation voltages. This state is called a comparative state. Further, a period during which the clock signal ACK is at the H2 level is called a comparative period.

In the comparative period, the transistor TP3 generates between the source and the drain a resistance value in accordance with the level of the input signal BDT1 supplied to the gate. Similarly, the transistor TP4 generates between the source and the drain a resistance value in accordance with the level of the input signal XBDT1 supplied to the gate.

For example, when the signal BDT1 is at the L level and the signal XBDT1 is at the H1 level, the on-resistance value of the transistor TP3 is smaller than the on-resistance value of the transistor TP4. In this case, the potential at the node N3 becomes higher than the potential at the node N4. Thus, the potential at the node N1 becomes higher than the potential at the node N2. In accordance with the potential at the node N2, the transistor TP5 is then activated, and the transistor TN6 is inactivated. Further, in accordance with the potential at the node N1, the transistor TP6 is inactivated, and the transistor TN7 is activated. Accordingly, the DC circuit 411 outputs the signal CDT1 at the L level and the inverted signal XCDT1 at the H2 level.

On the other hand, when the signal BDT1 is at the H1 level and the signal XBDT1 is at the L level, the potentials at the nodes N1 to N4 change in reverse of the above. In this case, in accordance with the potential at the node N2, the transistor TP5 is then inactivated, and the transistor TN6 is activated. Further, in accordance with the potential at the node N1, the transistor TP6 is activated, and the transistor TN7 is inactivated. Accordingly, the DC circuit 411 outputs the signal CDT1 at the H2 level and the inverted signal XCDT1 at the L level.

When the clock signal ACK changes from the H2 level to the L level, the inverter circuit 51 outputs the inverted clock signal XACK at the H2 level in response to the clock signal ACK at the L level. The DC circuit 411 (CLS circuit 361) thereupon transits to the reset state and outputs the signals CDT1 and XCDT1 at the L level. The L level, that is, the low potential voltage GND, is an example of a reset voltage.

The DC circuit 411 (CLS circuit 361) repeats alternately the reset state and the comparative state in response to the clock signal ACK. The DC circuit 411 then outputs the signals CDT1 and XCDT1 at the L level in the reset state (during the reset period). Further, the DC circuit 411 compares the input signals BDT1 and XBDT1 in the comparative state (during the comparative period) and converts the level of the input signal that is higher in level from the H1 level to the H2 level. Further, the DC circuit 411 outputs the output signal having the level of the input signal that is lower in level, that is, the L level, in accordance with the comparison result. Namely, the DC circuit 411 outputs the complementary signals CDT1 and XCDT1 in the comparative state.

The latch circuit 421 receives the output signals CDT1 and XCDT1 of the DC circuit 411 and outputs the complementary signals ADT1 and XADT1.

For example, the DC circuit 411 is in the comparative state and outputs the signal CDT1 at the H2 level and the inverted signal XCDT1 at the L level. At this time, the inverter circuit 61 outputs a signal at the L level in response to the signal CDT1 at the H2 level, and the inverter circuit 62 outputs a signal at the H2 level in response to the inverted signal XCDT1 at the L level.

The NAND circuit 63 outputs a signal at the H2 level in response to the signal at the L level output from the inverter circuit 61. Thus, the inverter circuit 65 outputs the signal XADT1 at the L level in response to the signal at the H2 level output from the NAND circuit 63. On the other hand, the NAND circuit 64 outputs a signal at the L level in response to the signal at the H2 level output from the inverter circuit 62 and the signal at the H2 level output from the NAND circuit 63. Thus, the inverter circuit 66 outputs the signal ADT1 at the H2 level in response to the signal at the L level output from the NAND circuit 64.

When both of the signals CDT1 and XCDT1 are at the L level, the inverter circuits 61 and 62 output the signals at the H2 level, respectively. Here, in the above example of the operation in the comparative state, two input signals supplied to the NAND circuit 63 are both at the L level, and the signal output from the NAND circuit 63 is at the H2 level. When transiting from the comparative state to the reset state, the NAND circuit 63 then receives the signal at the H2 level from the inverter circuit 61 and outputs the signal at the H2 level. In other words, when transiting from the comparative state to the reset state, the NAND circuit 63 holds the level of an output signal in the comparative state. On the other hand, in the above example of the operation in the comparative state, two input signals supplied to the NAND circuit 64 are both at the H2 level. The inverter circuit 62 then outputs the signal at the H2 level in the reset state. Therefore, even if transiting from the comparative state to the reset state, the two input signals supplied to the NAND circuit 64 do not change in level. Thus, the NAND circuit 64 holds the level of an output signal in the comparative state (in this case, the L level).

In this manner, when the DC circuit 411 is in the comparative state, that is, when the signals CDT1 and XCDT1 are at the complementary levels, the latch circuit 421 latches the signals CDT1 and XCDT1 and outputs the signals ADT1 and XADT1 in accordance with their respective latched levels. On the other hand, when the DC circuit 411 is in the reset state, that is, when both of the signals CDT1 and XCDT1 are at the L level, the latch circuit 421 holds the levels of the signals ADT1 and XADT1 at the levels in the comparative state.

Similarly to the CLS circuit 361, the CLS circuits 362 to 36*m* include DC circuits 412 to 41*m* and latch circuits 422 to 42*m*, respectively. The DC circuits 412 to 41*m* are similar to the DC circuit 411 in structure. Further, the latch circuits 422 to 42*m* are similar to the latch circuit 421 in structure. Therefore, the circuit diagrams and description of the DC circuits 412 to 41*m* and the latch circuits 422 to 42*m* are omitted.

Figure 6:
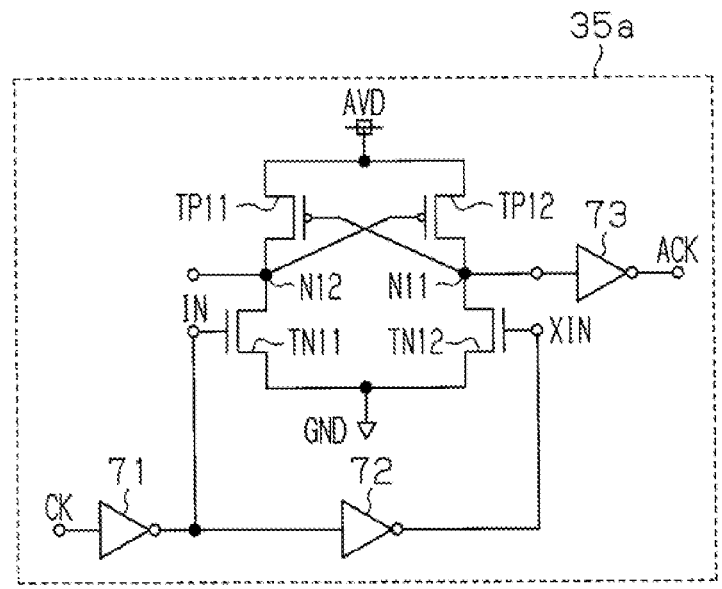
FIG. 6 is a circuit diagram of a level shift circuit.

FIG. 6 illustrates a first example of the structure of the level shift circuit 35 that converts the level of the clock signal CK.

A level shift circuit 35*a* of the first structure example includes inverter circuits 71 and 72. These inverter circuits 71 and 72 are supplied with the first high potential voltage VDD as the operation voltage. The inverter circuit 71 receives the clock signal CK having an amplitude range between the L level and the H1 level. The inverter circuit 71 outputs a logically inverted signal of the clock signal CK. The inverter circuit 72 outputs a logically inverted signal of an output signal of the inverter circuit 71.

The output signal of the inverter circuit 71 is supplied to a gate of an N-channel MOS transistor TN11. The output signal of the inverter circuit 72 is supplied to a gate of an N-channel MOS transistor TN12.

A source of the transistor TN11 is supplied with the low potential voltage GND. A drain of the transistor TN11 is coupled to a drain of a P-channel MOS transistor TP11 and a gate of a P-channel MOS transistor TP12. A source of the transistor TN12 is supplied with the low potential voltage GND. A drain of the transistor TN12 is coupled to a drain of the transistor TP12 and a gate of the transistor TP11. Sources of the transistors TP11 and TP12 are supplied with the second high potential voltage AVD as the operation voltage. The transistors TN11, TN12, TP11 and TP12 are formed by high withstanding voltage devices, the withstand voltage of which is set in accordance with the second high potential voltage AVD.

A node N11 between the drains of the transistors TN12 and TP12 is coupled to an input terminal of the inverter circuit 73. The inverter circuit 73 is supplied with the second high potential voltage AVD as the operation voltage. The inverter circuit 73 outputs the clock signal ACK having an amplitude range between the L level and the H2 level.

In the level shift circuit 35*a*, in response to the clock signal CK at the H1 level, the transistor TN11 is inactivated and the transistor TN12 is activated. Thus, the transistor TP11 is activated and the transistor TP12 is inactivated. The inverter circuit 73 then outputs the clock signal ACK at the H2 level in response to the potential at the node N11. On the other hand, in the case of the clock signal CK at the L level, the transistor TN11 is activated, and the transistor TN12 is inactivated, whereupon the transistor TP11 is inactivated and the transistor TP12 is activated. Thus, the inverter circuit 73 outputs the clock signal ACK at the L level. In this manner, the level shift circuit 35*a* converts the clock signal CK that amplifies between the level of the low potential voltage GND and the level of the first high potential voltage VDD into the clock signal ACK that amplifies between the level of the low potential voltage GND and the level of the second high potential voltage AVD.

The level shift circuit 35*a* configured in this manner may promote the suppression of power consumption. Namely, when the clock signal CK is at the L level, the N-channel MOS transistor TN11 is activated, and the potential at the node N12 is set to the L level, whereupon the P-channel MOS transistor TP12 is activated, and the level of the node N11 is set to the H2 level. The P-channel MOS transistor TP11 is then inactivated, and the N-channel MOS transistor TN12 is inactivated. Therefore, a flow-through current does not steadily flow through the level shift circuit 35*a*.

Figure 7:
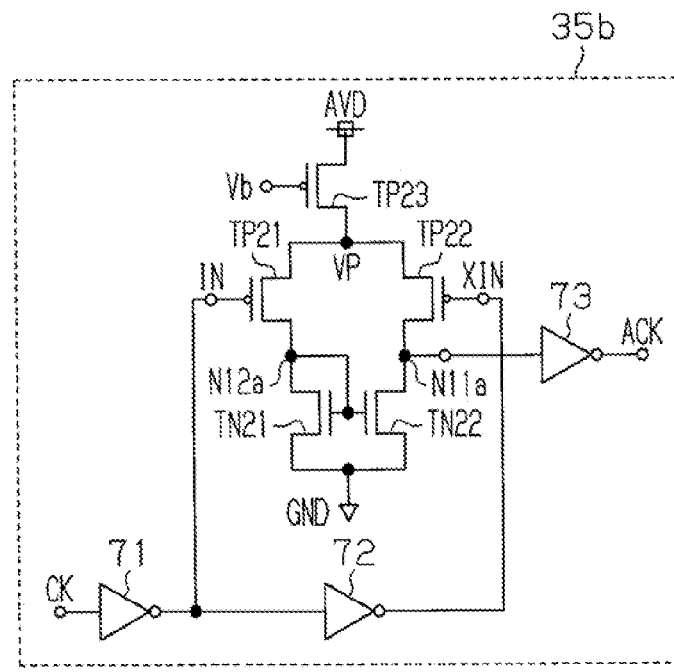
FIG. 7 is a circuit diagram of a level shift circuit.

FIG. 7 illustrates a second example of the structure of the level shift circuit 35 that converts the level of the clock signal CK.

In a level shift circuit 35*b* of the second structure example, the output signal of the inverter circuit 71 is supplied to a gate of a P-channel MOS transistor TP21. The output signal of the inverter circuit 72 is supplied to a gate of a P-channel MOS transistor TP22.

Sources of the transistors TP21 and TP22 are mutually coupled, and a coupling node VP therebetween is coupled to a drain of a P-channel MOS transistor TP23. A source of the transistor TP23 is supplied with the second high potential voltage AVD. A gate of the transistor TP23 is supplied with a bias voltage Vb with a given potential.

A drain of the transistor TP21 is coupled to a drain of an N-channel MOS transistor TN21. A drain of the transistor TP22 is coupled to a drain of an N-channel MOS transistor TN22. Gates of the transistors TN21 and TN22 are mutually coupled. Further, the gate of the transistor TN21 is coupled to the drain thereof. Sources of the transistors TN21 and TN22 are supplied with the low potential voltage GND. A node N11*a* between the drains of the transistors TP22 and TN22 is coupled to the input terminal of the inverter circuit 73. The transistors TP21, TP22, TP23, TN21 and TN22 are formed by high withstanding voltage devices, the withstand voltage of which is set in accordance with the second high potential voltage AVD.

The transistor TP23 feeds a constant current in accordance with the bias voltage Vb supplied to the gate thereof. In the level shift circuit 35b, when the clock signal CK is at the H1 level, the potential at the node N11a decreases. The inverter circuit 73 outputs the clock signal ACK at the H2 level in response to the potential at the node N11a. When the clock signal CK is at the L level, the potential at the node N11a increases. The inverter circuit 73 outputs the clock signal ACK at the L level in response to the potential at the node N11a.

The level shift circuit 35b configured in this manner deals with an input signal with a lower voltage. Namely, based on the clock signal CK, the signal output from the inverter circuit 71 is supplied to the gate of the P-channel MOS transistor TP21, and the signal output from the inverter circuit 72 is supplied to the gate of the P-channel MOS transistor TP22. Therefore, even when the first high potential voltage VDD supplied to the inverter circuits 71 and 72 as the operation voltage is low, both of the transistors TP21 and TP22 respond to the signal at the level of the first high potential voltage VDD. Accordingly, even if the voltage of the input signal decreases, the level shift circuit 35b may convert the clock signal CK from the H1 level to the H2 level.

The operation of the DAC circuit 30 configured as above will be described.

Figure 8:
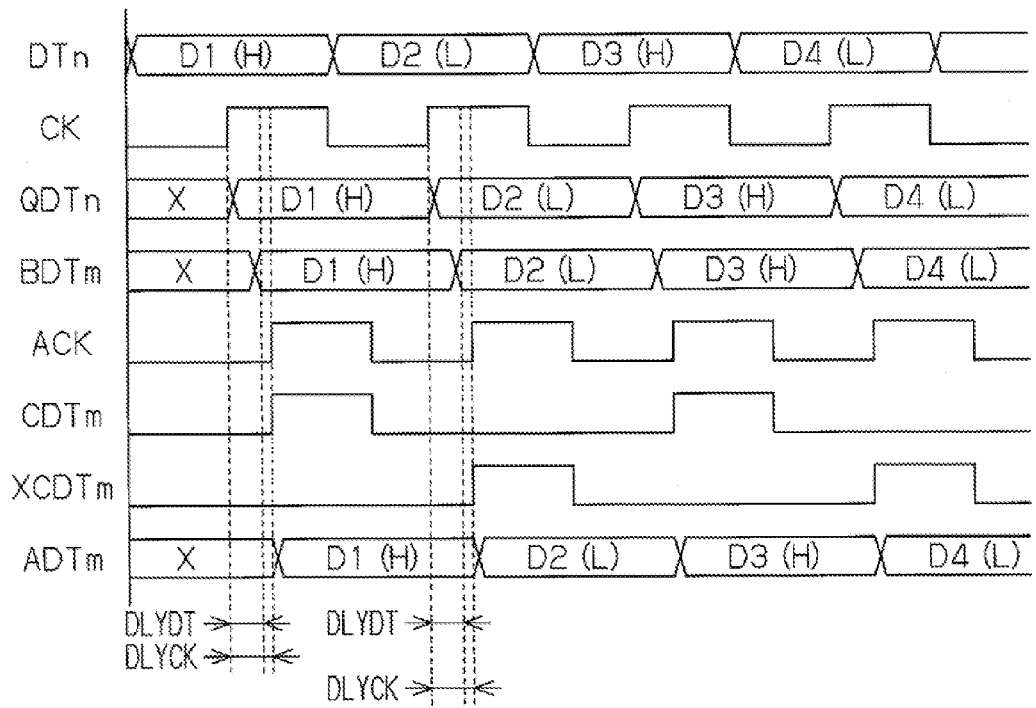
FIG. 8 is a timing chart illustrating the operation of the first embodiment.

As illustrated in FIG. 8, the DAC circuit 30 receives data D1 to D4 as the data signal DTn. As an example, the data D1 is at the H1 level (simply illustrated as "(H)"), the data D2 is at the L level, the data D3 is at the H1 level (simply illustrated as "(H)") and the data D4 is at the L level.

First, the data D1 is supplied and then the clock signal CK at the H1 level is supplied.

The FF circuit 33 illustrated in FIG. 2 captures the data D1 at the timing when the clock signal CK rises from the L level to the H1 level, and outputs the signal QDTn. The conversion circuit 34 illustrated in FIG. 2 decodes the signal QDTn and outputs the signal BDTm.

The level shift circuit 35 illustrated in FIG. 2 converts the level of the clock signal CK from the H1 level to the H2 level and outputs the clock signal ACK.

The DC circuit 41m illustrated in FIG. 4 transits to the comparative state in response to the clock signal ACK at the H2 level. In the comparative state, the DC circuit 41m converts the level of the signal BDTm from the H1 level to the H2 level and outputs the signal CDTm at the H2 level and the inverted signal XCDTm at the L level.

The latch circuit 42m illustrated in FIG. 4 outputs the signals ADTm and XADTm in accordance with the signals CDTm and XCDTm.

The driver circuit 37 illustrated in FIG. 2 generates a driving signal in response to the signal ADTm. The current conversion circuit 38 then outputs the current Io in response to the driving signals output from the driver circuit 37. In this manner, the DAC circuit 30 outputs the current Io in accordance with the data D1.

The level shift circuit 35 illustrated in FIG. 2 outputs the clock signal ACK at the L level in response to the clock signal CK at the L level. The DC circuit 41m transits to the reset state in response to the clock signal ACK at the L level. In the reset state, the DC circuit 41m outputs the signals CDTm and XCDTm at the L level. The latch circuits 421 to 42m hold the levels of the signals ADTm and XADTm in the comparative state based on the signals CDTm and XCDTm at the L level. Thus, the DAC circuit 30 continues to output the current Io in accordance with the data D1.

Next, the data D2 is supplied, and thereafter the clock signal CK at the H1 level is supplied. Similarly to the above, the CLS circuit 36 outputs the signal ADTm in accordance with the data D2. As a result, the DAC circuit 30 outputs the current Io in accordance with the data D2. The DAC circuit 30 then operates for the data D3 and D4 similarly to the above, and in turn outputs the current Io in accordance with the data D3 and the current Io in accordance with the data D4. In this manner, the CLS circuit 36m provided in the DAC circuit 30 repeats the change between the comparative state and the reset state at every cycle of the clock signal CK, converts the data signal DTn at the H1 level into the signal ADTm at the H2 level, and outputs the current Io in accordance with the signal ADTm.

The level conversion circuit of the first embodiment has the following advantages.

(1) The level shift circuit 31 that shifts the levels of the signals BDT1 to BDTm includes the clocked level shift circuit (CLS circuit) 36 (361 to 36m). The CLS circuit 361 includes the dynamic comparator circuit (DC circuit) 411 and the latch circuit 421. The CLS circuit 361 transits to the reset state in response to the clock signal ACK at the L level. In the reset state, the DC circuit 411 outputs the signals CDTm and XCDTm at the L level. Further, the CLS circuit 361 transits to the comparative state in response to the clock signal ACK at the H level. In the comparative state, the DC circuit 411 converts the signals BDTm and XBDTm at the H1 level into the signals CDTm and XCDTm at the H2 level. The latch circuit 421 outputs the complementary signals ADTm and XADTm in accordance with the complementary signals CDTm and XCDTm in the comparative state. Further, in the reset state, the latch circuit 421 holds the output levels in the comparative state in response to the signals CDTm and XCDTm at the L level.

Figure 1:
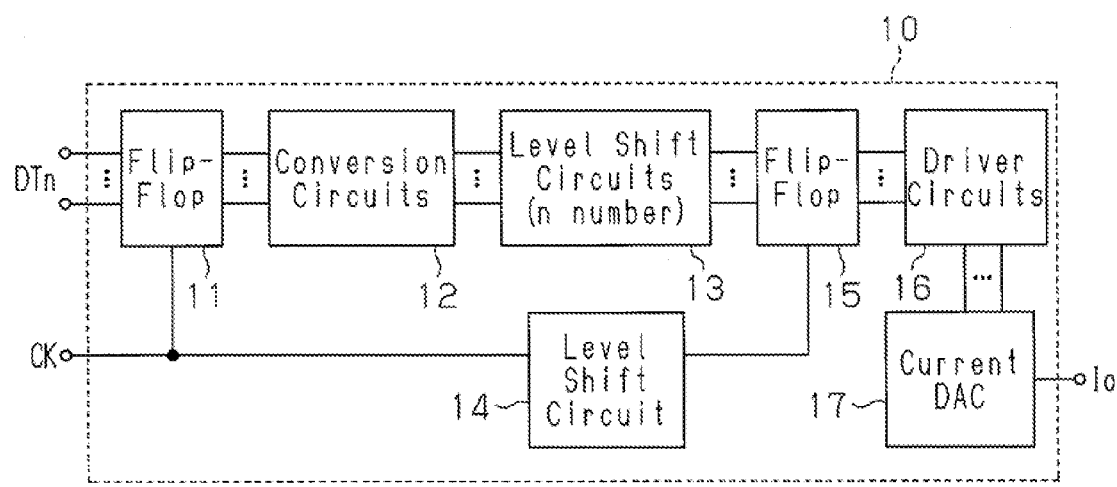
FIG. 1 is a block circuit diagram of a related-art D/A conversion circuit.

In the CLS circuit 361, the number of high withstanding voltage transistors included in the dynamic comparator circuit 411 and the latch circuit 421 is less than that of high withstanding voltage transistors included in a circuit that uses the level shift circuit 13 and the flip-flop circuit 15, which are illustrated in FIG. 1, and converts the level of a signal to latch it (the number is reduced to approximately two-thirds). Therefore, an area to form components used for performing the level shift is smaller than that of the conventional example. This reduces the area occupied by the level shift circuit.

(2) As illustrated in FIG. 5, the DC circuit 411 receives the signals BDT1 and XBDT1 (input signals IN and XIN) at the gates of the P-channel MOS transistors TP3 and TP4. The sources of the P-channel MOS transistors TP3 and TP4 are supplied with the second high potential voltage AVD via the transistor TP2 that has been activated. Thus, the transistors TP3 and TP4 are activated by the gate voltage between the low potential voltage GND and a voltage which is lower than the second high potential voltage AVD by a threshold voltage. Therefore, in the clocked level shift circuit 361, even if the levels of the signals BDT1 and XBDT1 become low, both of the transistors TP3 and TP4 operate to covert the signals BDT1 and XBDT1 at the H1 level into the signals ADT1 and XADT1 at the H2 level. Accordingly, the clocked level shift circuit 361 adapts to the input signal whose voltage is lowered and performs the level conversion appropriately.

(3) As illustrated in FIG. 5, when the DC circuit 411 is in the comparative state, the P-channel MOS transistor TP5 and the N-channel MOS transistor TN6 operate as the inverter circuit 53, and the P-channel MOS transistor TP6 and the N-channel MOS transistor TN7 operate as the inverter circuit 54. For example, when the signal BDT1 is at the L level and the inverted signal XBDT1 is at the H1 level, the P-channel MOS transistor TP6 and the N-channel MOS transistor TN6 are inactivated. Conversely, when the signal BDT1 is at the H1 level and the inverted signal XBDT1 is at the L level, the P-channel MOS transistor TP5 and the N-channel MOS transistor TN7 are inactivated. Therefore, a flow-through current does not steadily flow from a wiring supplied with the second high potential voltage AVD to a wiring supplied with the low potential voltage GND. Accordingly, the consumption current is reduced as compared with the case of using a circuit where a constant current, for example, is fed for the level shift.

Second Embodiment

Figure 10:
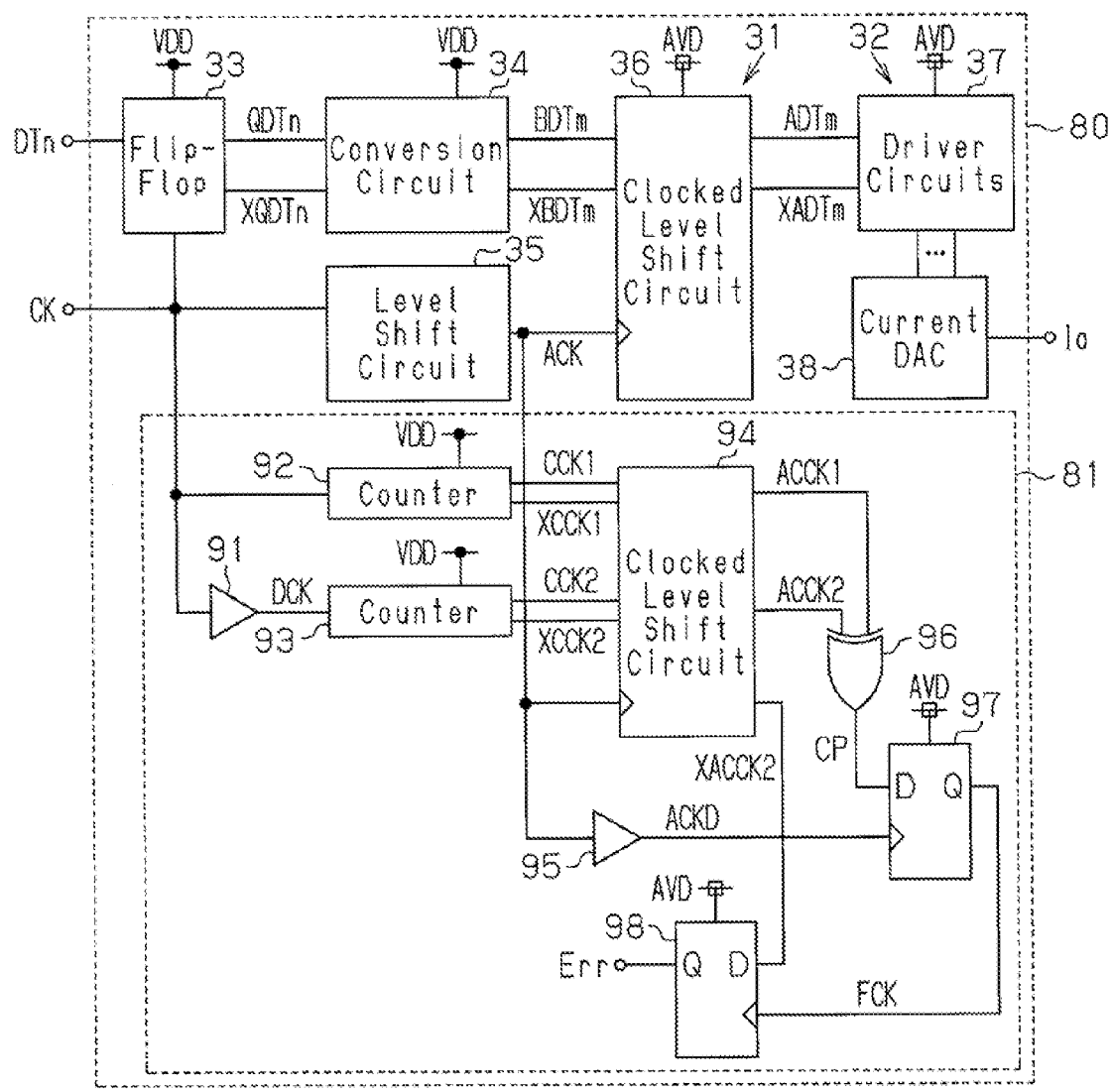
FIG. 10 is a block circuit diagram of a D/A conversion circuit of a second embodiment.

As illustrated in FIG. 10, a digital-to-analog conversion circuit (DAC circuit) 80 includes the level shift circuit 31, the analog circuit 32, and a detection circuit 81. The level shift circuit 31 performs the level conversion from the input signal DTn to the signals ADTm and XADTm. The analog circuit 32 generates the current Io in accordance with the signals ADTm and XADTm. The detection circuit 81 detects the state of the level shift circuit 31.

The detection circuit 81 is supplied with the clock signal CK based on the H1 level and the clock signal ACK based on the H2 level. The detection circuit 81 detects the operation timing of the level shift circuit 31 based on the clock signals CK and ACK and generates an error signal Err at a level in accordance with the detection result.

Here, the operation timing of the level shift circuit 31 will be described.

Figure 9:
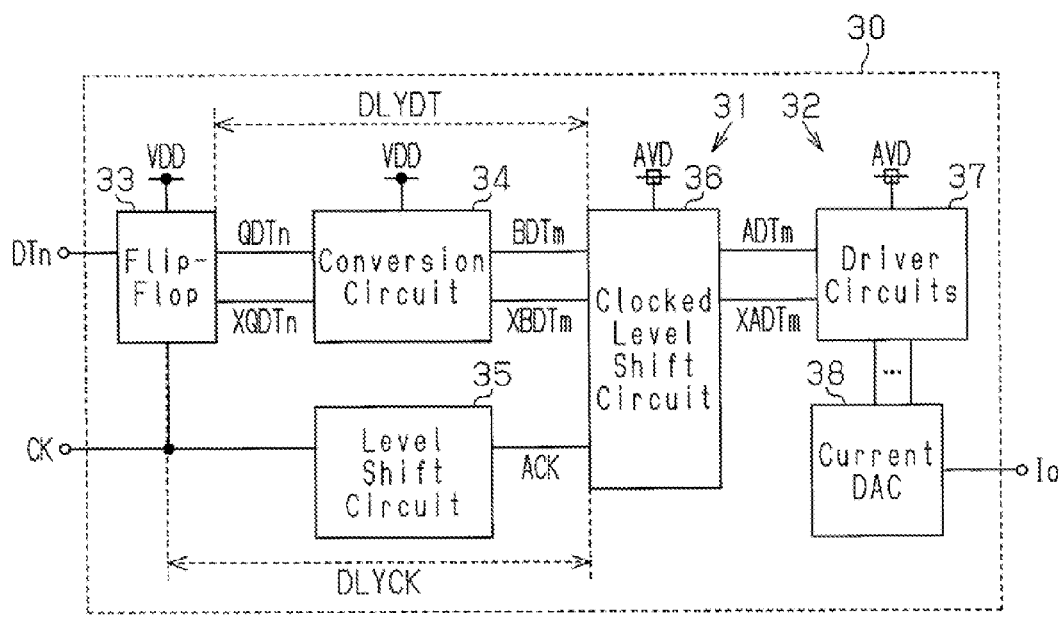
FIG. 9 is a timing explanatory view of the level shift circuit.

As illustrated in FIG. 9, the flip-flop circuit (FF circuit) 33 latches the data DTn in response to the clock signal CK at the H1 level. The clocked level shift circuit (CLS circuit) 36 transits to the comparative state in response to the clock signal ACK at the H2 level and converts the input signals BDTm and XBDTm at the H1 level into the signals ADTm and XADTm at the H2 level.

The clock signal ACK to which the CLS circuit 36 responds is affected by a delay in a signal transmission path from the output terminal of the FF circuit 33 to the input terminal of the CLS circuit 36, that is, a delay caused by the wiring and the operation of the level shift circuit 35, relative to the clock signal CK to which the FF circuit 33 responds.

The timing of a rising edge of the clock signal ACK to which the CLS circuit 36 responds is delayed by a delay time in the path that transmits the clock signal CK from the timing of a rising edge of the clock signal CK to which the FF circuit 33 responds. The delay time in the path that transmits the clock signal CK is set to be a clock delay DLYCK.

The conversion circuit 34 decodes the signals QDTn and XQDTn to generate the signals BDTm and XBDTm. The signals QDTn and XQDTn output from the FF circuit 33 are affected by a delay in a signal transmission path from the output terminal of the FF circuit 33 to the input terminal of the CLS circuit 36, that is, a delay caused by the wiring and the operation of the conversion circuit 34. In other words, changes in the signals QDTn and XQDTn output from the FF circuit 33 appear as changes in the signals BDTm and XBDTm received by the CLS circuit 36 after a lapse of the delay time in the signal transmission path between the FF circuit 33 and the CLS circuit 36. The delay time in the path that transmits the signals QDTn and XQDTn is set to be a data delay DLYDT.

The level shift circuit 31 latches the data DTn to generate the signals QDTn and XQDTn, converts the signals QDTn and XQDTn into the signals BDTm and XBDTm, and performs the level shift from the signals BDTm and XBDTm to the signals ADTm and XADTm. Therefore, if the rising of the clock signal ACK is faster than the arrival of the signals BDTm and XBDTm in accordance with the data DTn at the CLS circuit 36, the CLS circuit 36 captures uncertain data. Accordingly, the clock delay DLYCK is set to be longer than the data delay DLYDT (DLYDT<DLYCK) at every cycle to properly perform a series of processes of capturing data.

Further, the level shift circuit 31 converts the level of the data latched by the FF circuit 33 to output it in the similar cycle as the latched cycle, that is, during one cycle of the clock signal CK (clock signal ACK). To execute the processing, in addition to the above condition, the total value of the data delay DLYDT and one cycle of the clock signal CK (clock signal ACK) (1/fCK where fCK is the frequency of the clock signal CK) is set to be larger than the clock delay DLYCK (DLYCK<1/fCK+DLYDT).

In the level shift circuit 31, the characteristics and arrangement (wire delay) of components are set to satisfy the above conditions. However, the clock delay DLYCK and data delay DLYDT may be influenced by variations in process conditions due to the manufacture, changes in values of wire resistance and wire capacity due to the operation environment, and the like. The detection circuit 81 in the second embodiment monitors that the clock delay DLYCK is longer than the data delay DLYDT (DLYDT<DLYCK).

The structure of the detection circuit 81 will be described.

As illustrated in FIG. 10, the clock signal CK is supplied to a buffer circuit 91 and a counter 92.

The buffer circuit 91 adds to the clock signal CK a delay in accordance with a delay in the operation of the conversion circuit 34 to generate a delay clock signal DCK. The delay clock signal DCK is supplied to a counter 93. The buffer circuit 91 generates the delay clock signal DCK at the H1 level based on the first high potential voltage VDD supplied as the operation voltage.

For example, the buffer circuit 91 is formed by an inverter circuit with even-numbered stages. The number of stages of the inverter circuit is the total value of the number of stages of an inverter circuit arranged to generate the data delay DLYDT in the worst path (that is, a delay time of the latest signal among the signals BDTm and XBDTm received by the CLS circuit 36) and the number of stages of a single- or double-stage inverter circuit added to prevent the delay clock signal DCK from being inverted in relation to the clock signal CK.

The counters 92 and 93 are formed by, for example, T-type flip-flop circuits. The counters 92 and 93 are supplied with the first high potential voltage VDD as the operation voltage. The counters 92 and 93 have the similar structure. The counters 92 and 93 count edges (rising edges, for example) of an input signal, and output the count result.

The counter 92 counts the clock signal CK to output a signal CCK1 and an inverted signal XCCK1. These signals CCK1 and XCCK1 repeat the inversion at every edge (rising edge, for example) of the clock signal CK. In other words, the counter 92 generates a frequency-divided signal CCK1 by dividing the frequency of the clock signal CK by two (divide-by-two), and generates an inverted frequency-divided signal XCCK1 by logically inverting the signal CCK1. The counter 92 is an example of a first frequency dividing circuit.

The counter 93 counts the delay clock signal DCK and outputs a signal CCK2 and an inverted signal XCCK2. These signals CCK2 and XCCK2 repeat the inversion at every edge (rising edge, for example) of the clock signal CK. In other words, the counter 93 generates a frequency-divided signal CCK2 by dividing the frequency of the delay clock signal DCK by two (divide-by-two), and generates an inverted frequency-divided signal XCCK2 by logically inverting the signal CCK2. The counter 93 is an example of a second frequency dividing circuit.

Figure 11:
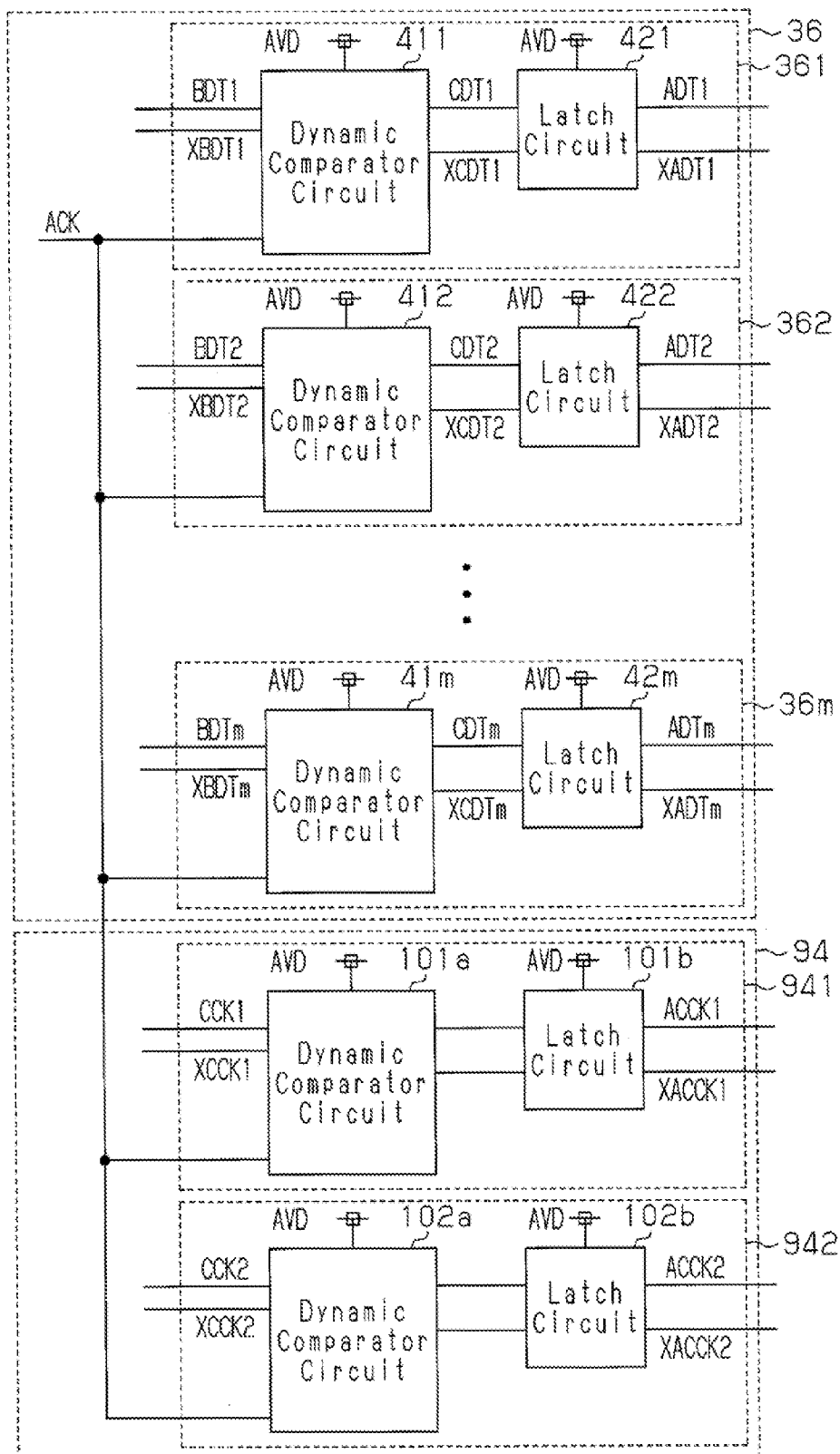
FIG. 11 is a block circuit diagram of a clocked level shift circuit of the second embodiment.

As illustrated in FIG. 11, a clocked level shift circuit (CLS circuit) 94 includes two clocked level shift circuits (CLS circuits) 941 and 942, each of which has a structure similar to that of the clocked level shift circuit 36. The first CLS circuit 941 includes a dynamic comparator circuit (DC circuit) 101*a* and a latch circuit 101*b*. The DC circuit 101*a* receives the signals CCK1 and XCCK1 and outputs signals in accordance with the comparative state and the reset state. The latch circuit 101*b* generates complementary signals (shifted frequency-divided signals) ACCK1 and XACCK1 based on the output signals of the DC circuit 101*a*. The first CLS circuit 941 is an example of a first frequency-divided signal conversion circuit.

Similarly, the second CLS circuit 942 includes a dynamic comparator circuit (DC circuit) 102*a* and a latch circuit 102*b*. The DC circuit 102*a* receives the signals CCK2 and XCCK2 and outputs signals in accordance with the comparative state and the reset state. The latch circuit 102*b* generates complementary signals (shifted frequency-divided signals) ACCK2 and XACCK2 based on the output signals of the DC circuit 102*a*. The second CLS circuit 942 is an example of a second frequency-divided signal conversion circuit.

As illustrated in FIG. 10, the clock signal ACK is supplied to a buffer circuit 95. For example, the buffer circuit 95 is formed by an inverter circuit with even-numbered stages. The buffer circuit 95 adds to the clock signal ACK a delay in the operation of one CLS circuit, that is, a delay in accordance with delays in the operations of the DC circuit and the latch circuit, to generate a delay clock signal ACKD. The delay clock signal ACKD is supplied to a FF circuit 97. The buffer circuit 95 generates the delay clock signal ACKD at the H2 level based on the second high potential voltage AVD supplied as the operation voltage.

The signals ACCK1 and ACCK2 output from the CLS circuit 94 are supplied to an EOR circuit 96. The EOR circuit 96 calculates an exclusive OR of the signals ACCK1 and ACCK2 to generate a detection signal CP having a level in accordance with the calculation result. The EOR circuit 96 is an example of a calculation circuit. The detection signal CP is supplied to the flip-flop circuit (FF circuit) 97.

The FF circuit 97 is a D-type flip-flop circuit and receives the second high potential voltage AVD as the operation voltage. A data terminal of the FF circuit 97 is supplied with the detection signal CP. A clock terminal of the FF circuit 97 is supplied with the delay clock signal ACKD. The FF circuit 97 latches the detection signal CP in response to the delay clock signal ACKD at the H2 level and outputs a signal FCK having the latched level. The signal FCK is supplied to a flip-flop circuit (FF circuit) 98.

The FF circuit 98 is a D-type flip-flop circuit and receives the second high potential voltage AVD as the operation voltage. A data terminal of the FF circuit 98 is supplied with the inverted signal XACCK2 output from the CLS circuit 94. A clock terminal of the FF circuit 98 is supplied with the signal FCK output from the FF circuit 97. The FF circuit 98 latches the inverted signal XACCK2 in response to the signal FCK at the H2 level and outputs the error signal Err having the latched level.

The operation of the detection circuit 81 configured as above will be described.

In the following description of the operation timing, the levels of the first high potential voltage VDD and the second high potential voltage AVD are referred to as the "H level" for convenience of description.

Figure 12:
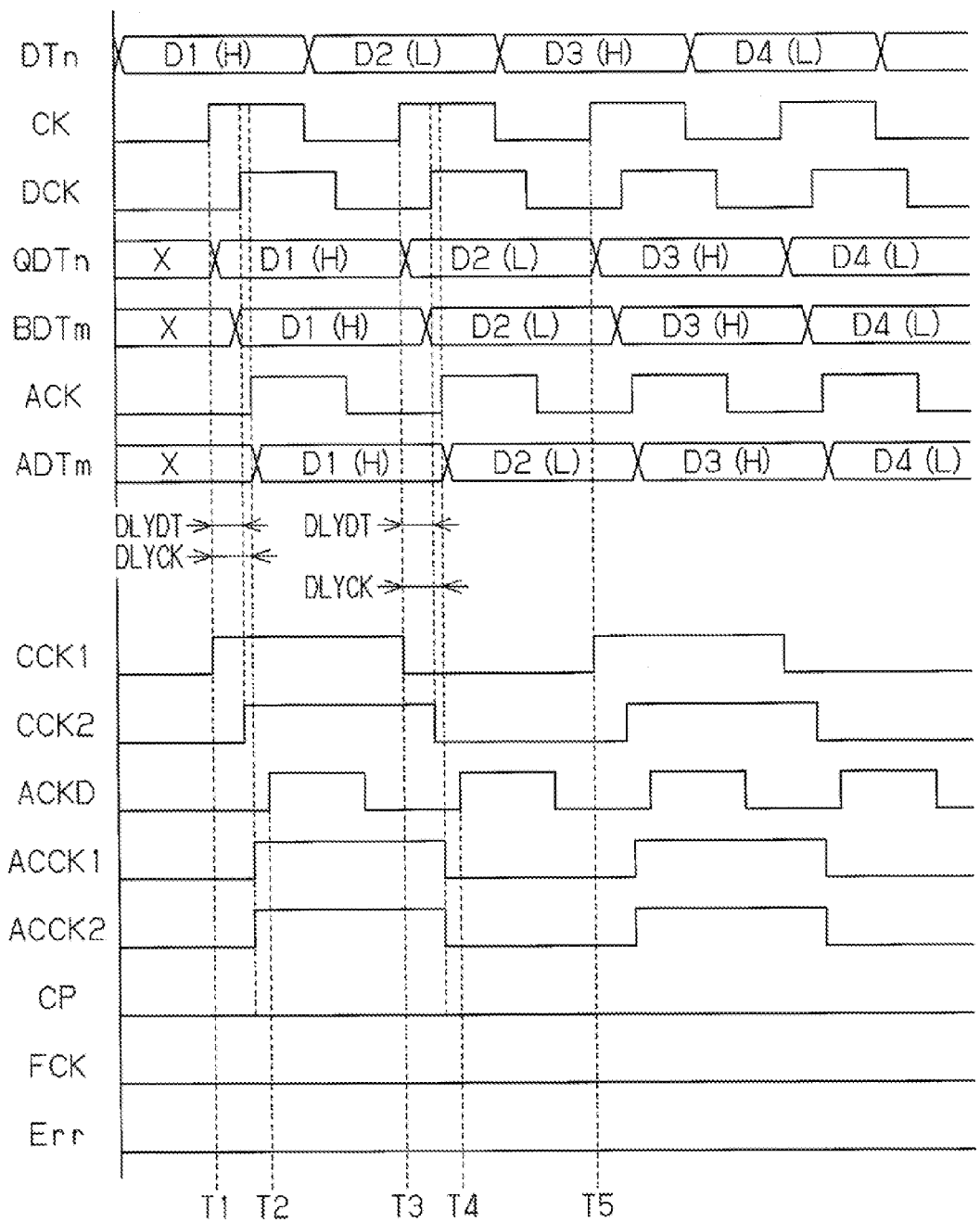
FIG. 12 is a timing chart illustrating the operation of the second embodiment.

As illustrated in FIG. 12, when the clock signal CK changes from the L level to the H level at a time T1, the signal CCK1 changes to the H level. Next, when the delay clock signal DCK changes from the L level to the H level, the signal CCK2 changes to the H level.

After a lapse of the clock delay DLYCK from a rising timing of the clock signal CK, the clock signal ACK changes from the L level to the H level, and both of the signals ACCK1 and ACCK2 change to the H level. Thus, the EOR circuit 96 illustrated in FIG. 10 outputs the detection signal CP at the L level.

Next, when the delay clock signal ACKD changes from the L level to the H level at a time T2, the FF circuit 97 illustrated in FIG. 10 latches the detection signal CP. Since the detection signal CP is at the L level at this time, the FF circuit 97 outputs the signal FCK at the L level. As a result, the error signal Err does not change and is thus maintained at the L level.

Next, when the clock signal CK changes from the L level to the H level at a time T3, the signal CCK1 changes to the L level. Next, when the delay clock signal DCK changes from the L level to the H level, the signal CCK2 changes to the L level. After a lapse of the clock delay DLYCK from a rising timing of the clock signal CK, the clock signal ACK changes from the L level to the H level, and both of the signals ACCK1 and ACCK2 change to the L level. At this time, the detection signal CP stays at the L level.

Next, when the delay clock signal ACKD changes from the L level to the H level at a time T4, the FF circuit 97 illustrated in FIG. 10 latches the detection signal CP. Since the detection signal CP is at the L level at this time, the FF circuit 97 outputs the signal FCK at the L level. As a result, the error signal Err does not change and is thus maintained at the L level.

Next, after a lapse of a time corresponding to two cycles of the clock signal CK from the time T1, the signals CCK1 and CCK2 return to the initial states (time T5). In this manner, the above operations are repeated at every two cycles of the clock signal CK. With a timing design as in the above, the error signal Err is maintained at the L level. Thus, a timing error does not occur.

Figure 13:
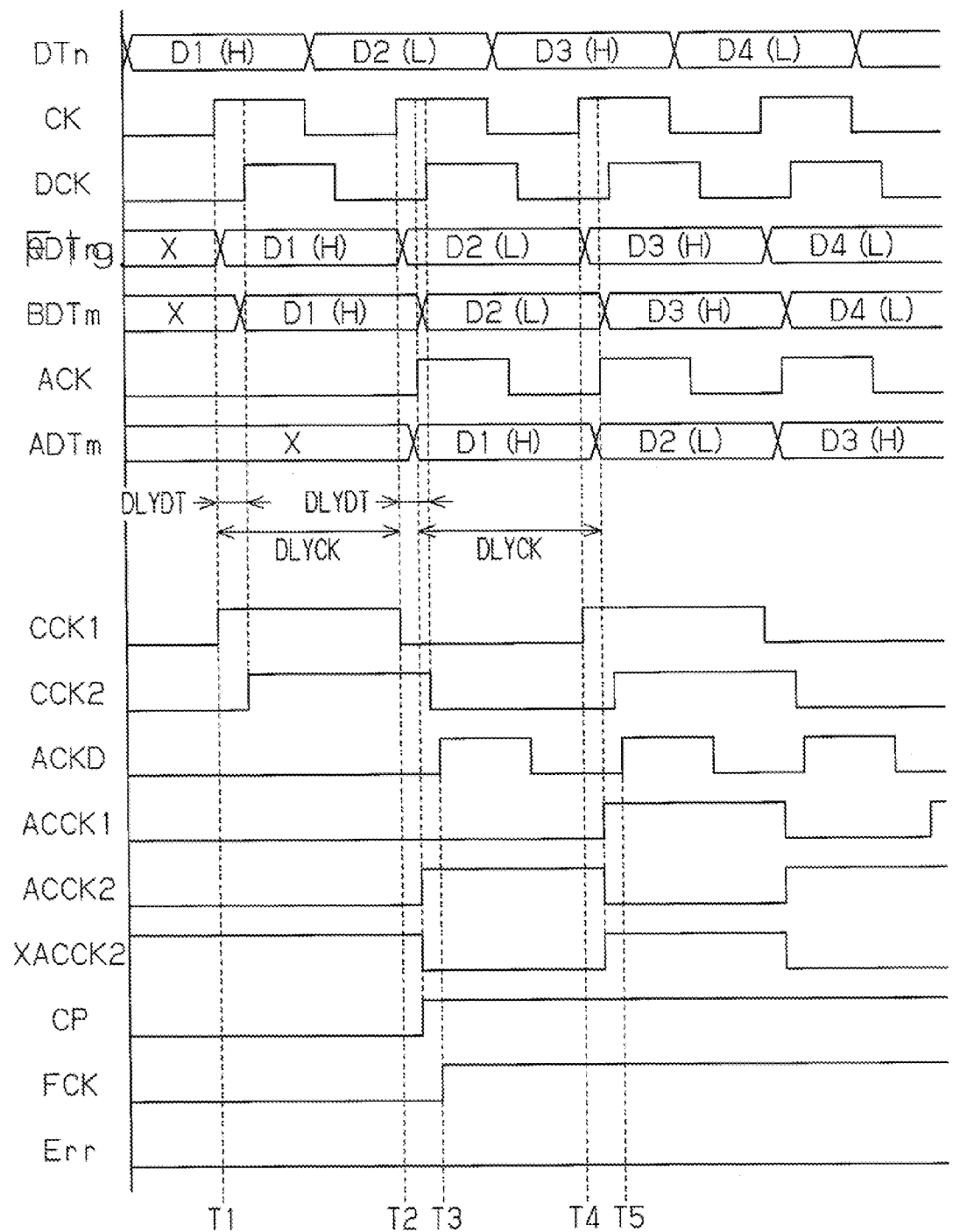
FIG. 13 is a timing chart illustrating the operation of the second embodiment.

As illustrated in FIG. 13, when the clock signal CK changes from the L level to the H level at a time T1, the signal CCK1 changes to the H level. Next, when the delay clock signal DCK changes from the L level to the H level, the signal CCK2 changes to the H level. Next, when the clock signal CK changes from the L level to the H level at a time T2, the signal CCK1 changes to the L level.

Next, after a lapse of the clock delay DLYCK from a rising timing of the clock signal CK at the time T1, the clock signal ACK changes from the L level to the H level. As a result, the signal ACCK1 maintains the L level, and the signal ACCK2 changes to the H level. Therefore, the detection signal CP changes to the H level. Next, when the delay clock signal DCK changes from the L level to the H level, the signal CCK2 changes to the L level.

Next, when the delay clock signal ACKD changes from the L level to the H level at a time T3, the FF circuit 97 illustrated in FIG. 10 latches the detection signal CP. Since the detection signal CP is at the H level at this time, the FF circuit 97 outputs the signal FCK at the H level. The FF circuit 98 illustrated in FIG. 10 latches the signal XACCK2 in response to the signal FCK at the H level. Since the signal XACCK2 is at the L level at this time, the FF circuit 98 outputs the error signal Err at the L level.

Next, when the clock signal CK changes from the L level to the H level at a time T4, the signal CCK1 changes to the H level. Next, after a lapse of the clock delay DLYCK from a rising timing of the clock signal at the time T2, the clock signal ACK changes from the L level to the H level. As a result, the signal ACCK1 changes to the H level, and the signal ACCK2 changes to the L level. Therefore, the detection signal CP stays at the H level.

Next, when the delay clock signal ACKD changes from the L level to the H level at a time T5, the FF circuit 97 illustrated in FIG. 10 latches the detection signal CP. Since the detection signal CP is at the H level at this time, the FF circuit 97 outputs the signal FCK at the H level. In other words, the signal FCK is maintained at the H level. Therefore, the FF circuit 98 does not perform the latch operation. Accordingly, the error signal Err is maintained at the L level.

In this manner, when the clock delay DLYCK is longer than one cycle of the clock signal CK, the level shift circuit 31 outputs the signal ADTm at a timing when the clock signal ACK is delayed.

Figure 14:
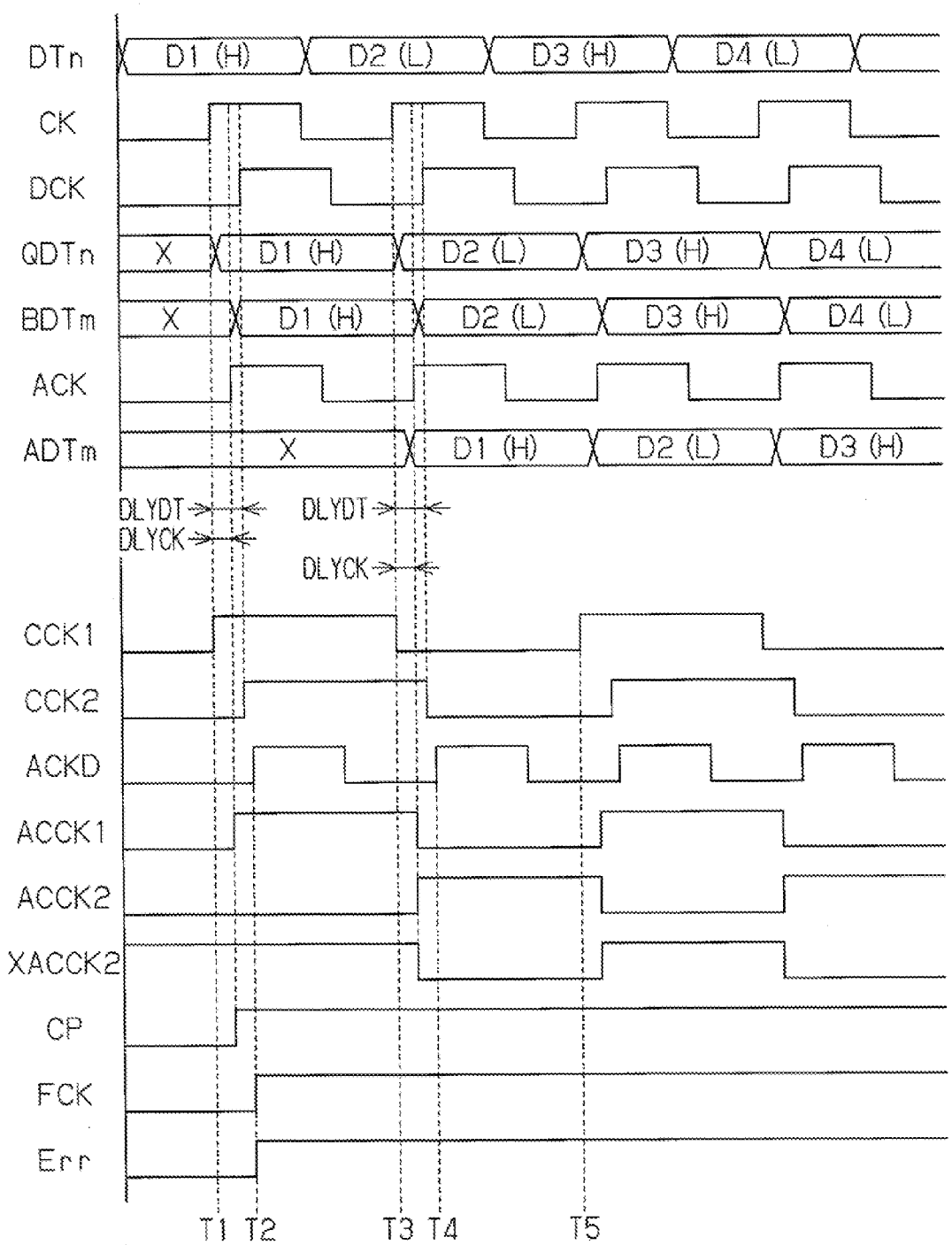
FIG. 14 is a timing chart illustrating the operation of the second embodiment.

As illustrated in FIG. 14, when the clock signal CK changes from the L level to the H level at a time T1, the signal CCK1 changes to the H level. Next, after a lapse of the clock delay DLYCK from a rising timing of the clock signal CK, the clock signal ACK changes from the L level to the H level. As a result, the signal ACCK1 changes to the H level, and the signal ACCK2 maintains the L level. Therefore, the detection signal CP changes to the H level. Thereafter, when the delay clock signal DCK changes from the L level to the H level, the signal CCK2 changes to the H level.

Next, when the delay clock signal ACKD changes from the L level to the H level at a time T2, the FF circuit 97 illustrated in FIG. 10 latches the detection signal CP at the H level and changes the signal FCK from the L level to the H level. The FF circuit 98 latches the signal XACCK2 in response to the signal FCK at the H level. Since the signal XACCK2 is at the H level at this time, the FF circuit 98 outputs the error signal Err at the H level.

Next, after a lapse of a time corresponding to one cycle of the clock signal CK from the time T1, the clock signal CK changes from the L level to the H level, and the signal CCK1 changes to the L level (time T3). Next, when the clock signal ACK changes from the L level to the H level, the signal ACCK1 changes to the L level, and the signal ACCK2 changes to the H level. Therefore, the detection signal CP is maintained at the H level. Thereafter, when the delay clock signal DCK changes from the L level to the H level, the signal CCK2 changes to the L level.

Next, when the delay clock signal ACKD changes from the L level to the H level at a time T4, the FF circuit 97 illustrated in FIG. 10 latches the detection signal CP. Since the detection signal CP is at the H level at this time, the FF circuit 97 outputs the signal FCK at the H level. In other words, the signal FCK is maintained at the H level. Therefore, the FF circuit 98 does not perform the latch operation. Accordingly, the error signal Err is maintained at the H level.

Next, after a lapse of a time corresponding to two cycles of the clock signal CK from the time T1, the signals CCK1 and CCK2 return to the initial states (time T5). At this time, the error signal Err is maintained at the H level.

The error signal Err is observed by, for example, a test device for a semiconductor integrated circuit. The test device is, for example, a wafer-level test device or a test device for a packaged-semiconductor integrated circuit. The test device supplies the clock signal CK corresponding to two cycles to a semiconductor integrated circuit. The clock signal CK corresponding to two cycles causes the detection circuit 81 to detect the operation timing of the level shift circuit 31 and output the error signal Err. As described above, the error signal Err is maintained at the L level when a timing error does not occur, and is maintained at the H level when a timing error occurs. Therefore, after supplying the clock signal CK, the test device determines whether or not there is a timing error by observing the error signal Err at an arbitrary timing. Accordingly, a test device of which the operation speed is relatively slow may test a semiconductor integrated circuit operating with a shorter cycle of the clock signal CK.

There is a case where the test device may not observe the error signal Err, in other words, a semiconductor integrated circuit may not be provided with a terminal for observing the error signal Err with an external device of the semiconductor integrated circuit. In this case, the output current Io generated by the current conversion circuit 38 may result in a test result of "failure" in the test device. For example, the error signal Err is supplied to the driver circuit 37 illustrated in FIG. 10. When the error signal Err is at the H level, the driver circuit 37 generates driving signals to cause the current conversion circuit 38 to output the current Io of a given value (for example, the maximum current) regardless of the input signals ADTm and XADTm. The test device changes the input signal, namely, the data signal DTn, and determines the state of the DAC circuit 80 based on a fact whether or not the current Io in accordance with the data signal DTn is output. Thus, when the current Io does not change in relation to the data signal DTn, the test device determines the DAC circuit 80 to be in failure.

The level conversion circuit of the second embodiment has the following advantages.

(1) The detection circuit 81 detects the operation timings of the flip-flop circuit 33 and the CLS circuit 36 and generates the error signal Err in accordance with the detection result. Thus, the use of the error signal Err allows for the detection of an error in the operation timings of the flip-flop circuit 33 and the CLS circuit 36.

(2) The detection circuit 81 includes the buffer circuit 91. The buffer circuit 91 adds to the clock signal CK a delay time in relation to the signal transmission path from the flip-flop circuit 33 to the CLS circuit 36 to generate the delay clock signal DCK. The CLS circuit 94 converts the frequency-divided signal CCK1 of the clock signal CK and the frequency-divided signal CCK2 of the delay clock signal DCK from the level of the first high potential voltage VDD to the level of the second high potential voltage AVD in response to the second clock signal ACK to thereby generate the first and second shifted frequency-divided signals ACCK1 and ACCK2.

The first and second shifted frequency-divided signals ACCK1 and ACCK2 change in accordance with the relationship in length between the data delay time DLYDT and the clock delay DLYCK. When the clock delay DLYCK is longer than the data delay DLYDT (DLYDT<DLYCK) within a cycle of the clock signal CK, the levels of both the signals ACCK1 and ACCK2 change in the similar phase (refer to FIG. 12). On the other hand, when the data delay DLYDT is longer than the clock delay DLYCK (DLYDT>DLYCK) within a cycle of the clock signal CK, the levels of both the signals ACCK1 and ACCK2 change in the opposite phase (refer to FIG. 14). The detection signal CP is obtained in accordance with the relationship in length between the data delay DLYDT and the clock delay DLYCK by performing a logic operation (exclusive OR operation) of the signals ACCK1 and ACCK2. Accordingly, the detection of changes in the levels of the signals ACCK1 and ACCK2 allows for the monitoring of the condition (DLYDT<DLYCK) for the operation of the level shift circuit 31.

(3) The FF circuit 97 latches the detection signal CP in response to the delay clock signal ACKD and outputs the signal FCK. The delay clock signal ACKD is obtained by delaying the second clock signal ACK in accordance with a delay time of the CLS circuit 94. The CLS circuit 94 logically inverts the second shifted frequency-divided signal ACCK2 to generate the inverted signal XACCK2. The FF circuit 98 latches the inverted signal XACCK2 in response to the output signal FCK of the FF circuit 97. When the clock delay DLYCK is longer than a cycle of the clock signal CK, the levels of the first and second shifted frequency-divided signals ACCK1 and ACCK2 change in the opposite phase (refer to FIG. 13). In this case, the EOR circuit 96 outputs the signal FCK at the H level. At this time, the inverted signal XACCK1 is at the L level. Thus, the FF circuit 98 outputs the error signal Err at the L level. Accordingly, even when the clock delay DLYCK is longer than a cycle of the clock signal CK, false detection of a timing error in the level shift circuit 31 is prevented.

Third Embodiment

Figure 15:
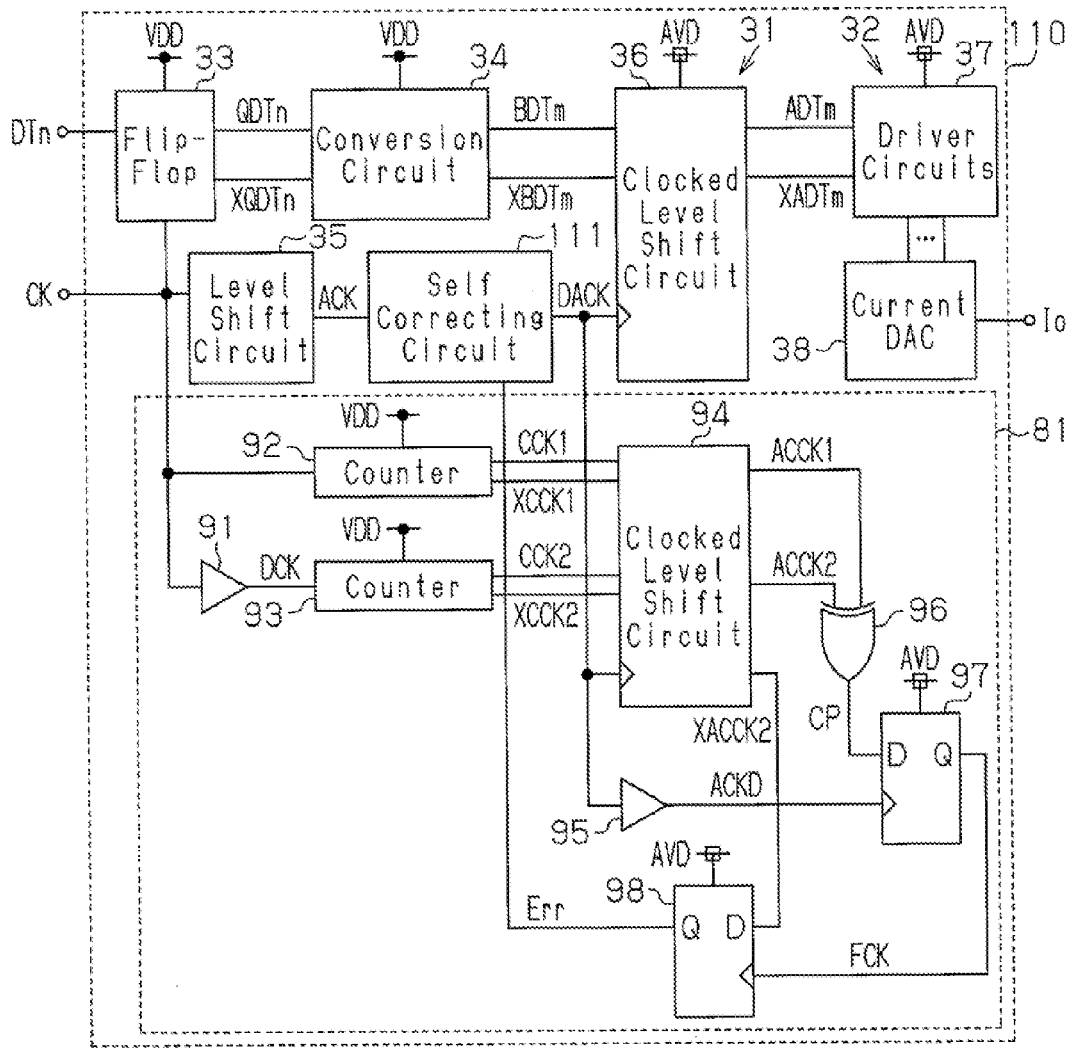
FIG. 15 is a block circuit diagram of a D/A conversion circuit of a third embodiment.

As illustrated in FIG. 15, a digital-to-analog conversion circuit (DAC circuit) 110 includes the level shift circuit 31, the analog circuit 32, the detection circuit 81, and a self correcting circuit 111. The detection circuit 81 detects the operation timing of the level shift circuit 31 based on the clock signals CK and ACK and generates the error signal Err at a level in accordance with the detection result.

The self correcting circuit 111 corrects the operation timing of the level shift circuit 31 based on the error signal Err. In the level shift circuit 31, the self correcting circuit 111 is coupled between the level shift circuit 35 and the clocked level shift circuit 36. The self correcting circuit 111 receives the clock signal ACK output from the level shift circuit 35. The self correcting circuit 111 adds a delay in accordance with the error signal Err to the clock signal ACK to generate the delay clock signal DACK. The CLS circuits 36 and 94 and the buffer circuit 95 operate in response to the delay clock signal DACK.

Figure 16:
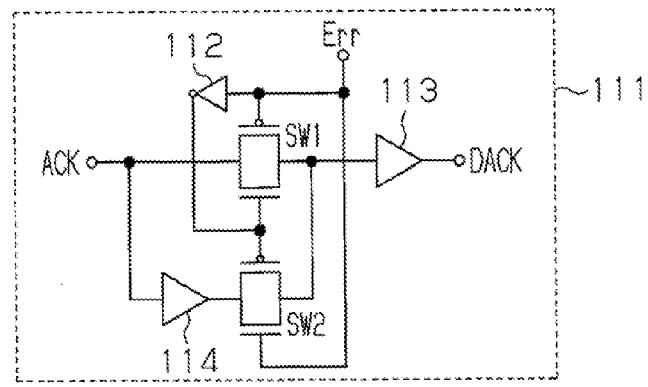
FIG. 16 is a circuit diagram of a self correcting circuit.

As illustrated in FIG. 16, the self correcting circuit 111 includes first and second switches SW1 and SW2 that are turned on and off complementarily in response to the error signal Err. The first switch SW1 includes a P-channel MOS transistor and an N-channel MOS transistor, which are coupled in parallel with each other. A gate of the P-channel MOS transistor is supplied with the error signal Err. A gate of the N-channel MOS transistor is supplied with a logically inverted signal of the error signal Err from an inverter circuit 112. Similarly, the second switch SW2 includes a P-channel MOS transistor and an N-channel MOS transistor, which are coupled in parallel with each other. A gate of the N-channel MOS transistor of the switch SW2 is supplied with the error signal Err. A gate of the P-channel MOS transistor of the switch SW2 is supplied with a logically inverted signal of the error signal Err from the inverter circuit 112.

The first switch SW1 includes a first terminal for receiving the clock signal ACK and a second terminal coupled to an input terminal of a buffer circuit 113. The clock signal ACK is further supplied to a delay circuit 114. The second switch SW2 includes a first terminal coupled to an output terminal of the delay circuit 114 and a second terminal coupled to an input terminal of the buffer circuit 113. The buffer circuit 113 outputs the delay clock signal DACK.

The first switch SW1 is turned on in response to the error signal Err at the L level, and is turned off in response to the error signal Err at the H level. The second switch SW2 is turned off in response to the error signal Err at the L level, and is turned on in response to the error signal Err at the H level. Thus, the first switch SW1 is turned on when an error is not detected, and is turned off when an error is detected. The second switch SW2 is turned off when an error is not detected, and is turned on when an error is detected.

Next, the operation of the self correcting circuit 111 configured as above will be described.

Figure 17:
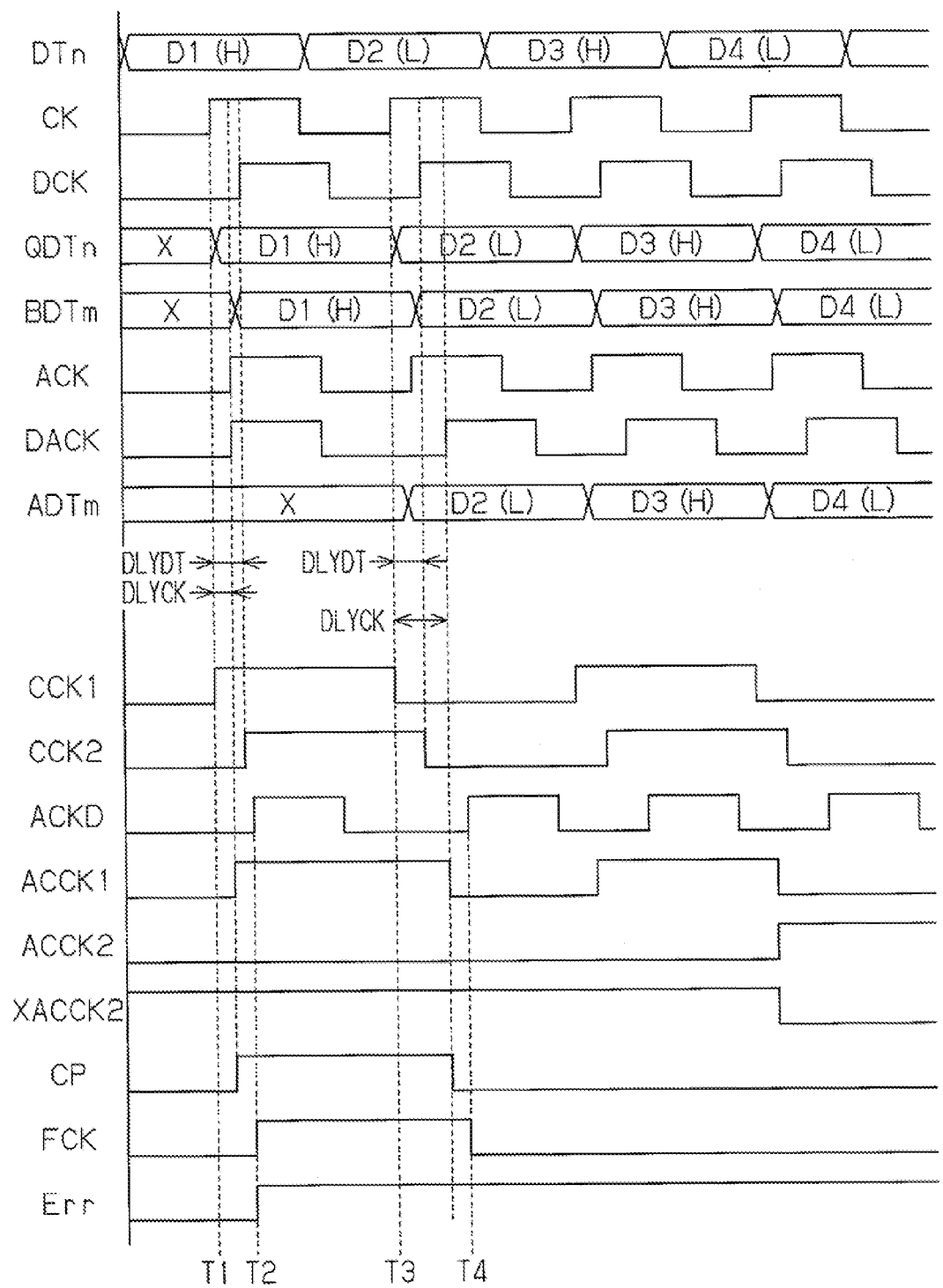
FIG. 17 is a timing chart illustrating the operation of the third embodiment.

As illustrated in FIG. 17, when the clock signal CK changes from the L level to the H level at a time T1, the signal CCK1 changes to the H level. Next, after a lapse of the clock delay DLYCK from a rising timing of the clock signal CK, the clock signal ACK (delay clock signal DACK) changes from the L level to the H level. As a result, the signal ACCK1 changes to the H level, and the signal ACCK2 stays at the L level. Therefore, the detection signal CP changes to the H level. Thereafter, when the delay clock signal DCK changes from the L level to the H level, the signal CCK2 changes to the H level.

Next, when the delay clock signal ACKD changes from the L level to the H level at a time T2, the FF circuit 97 illustrated in FIG. 15 latches the detection signal CP at the H level and changes the signal FCK from the L level to the H level. The FF circuit 98 thereupon latches the signal XACCK2 in response to the signal FCK at the H level. Since the signal XACCK2 is at the H level at this time, the FF circuit 98 outputs the error signal Err at the H level.

The error signal Err at the H level turns off the switch SW1 and turns on the switch SW2 in the self correcting circuit 111 illustrated in FIG. 16, respectively. Thus, the self correcting circuit 111 generates the delay clock signal DACK that is delayed from the clock signal ACK by delay times of the buffer circuit 113 and the delay circuit 114. Therefore, the clock delay DLYCK becomes longer by a delay time of the delay circuit 114 illustrated in FIG. 16. For example, the delay time of the delay circuit 114 is set to be a half cycle of the clock signal ACK. However, as long as the level shift circuit 31 is designed to satisfy the condition (DLYDT<DLYCK), the delay time of the delay circuit 114 may be shorter than or equal to the half cycle of the clock signal ACK.

Next, when the clock signal CK changes from the L level to the H level at a time T3, the signal CCK1 changes to the L level. Next, when the delay clock signal DCK changes from the L level to the H level, the signal CCK2 changes to the L level.

Next, when the delay clock signal DACK of which the delay time is adjusted relative to the clock signal ACK changes from the L level to the H level, the signal ACCK1 changes to the L level. The signal ACCK2 is maintained at the L level at this time. Therefore, the detection signal CP changes to the L level.

Next, when the delay clock signal ACKD changes from the L level to the H level at a time T4, the FF circuit 97 illustrated in FIG. 15 latches the detection signal CP. Since the detection signal CP is at the L level at this time, the FF circuit 97 outputs the signal FCK at the L level. Thereafter, since the detection signal CP is maintained at the L level, the signal FCK is maintained at the L level. As a result, the error signal Err is maintained at the H level. When the error signal Err is at the H level, the self correcting circuit 111 adds the delay time of the delay circuit 114 to the clock signal ACK to output the delay clock signal DACK. Accordingly, the level shift circuit 31 operates at a normal operation timing.

The level conversion circuit of the third embodiment has the following advantage.

(1) The self correcting circuit 111 generates the delay clock signal DACK from the second clock signal ACK as well as corrects the delay time of the delay clock signal DACK based on the error signal Err of the detection circuit 81. In other words, when the clock delay DLYCK is shorter than the data delay DLYDT, the self correcting circuit 111 lengthens the delay time of the delay clock signal DACK relative to the second clock signal ACK. This corrects the operation timing of the level shift circuit 31.

Fourth Embodiment

Figure 18:
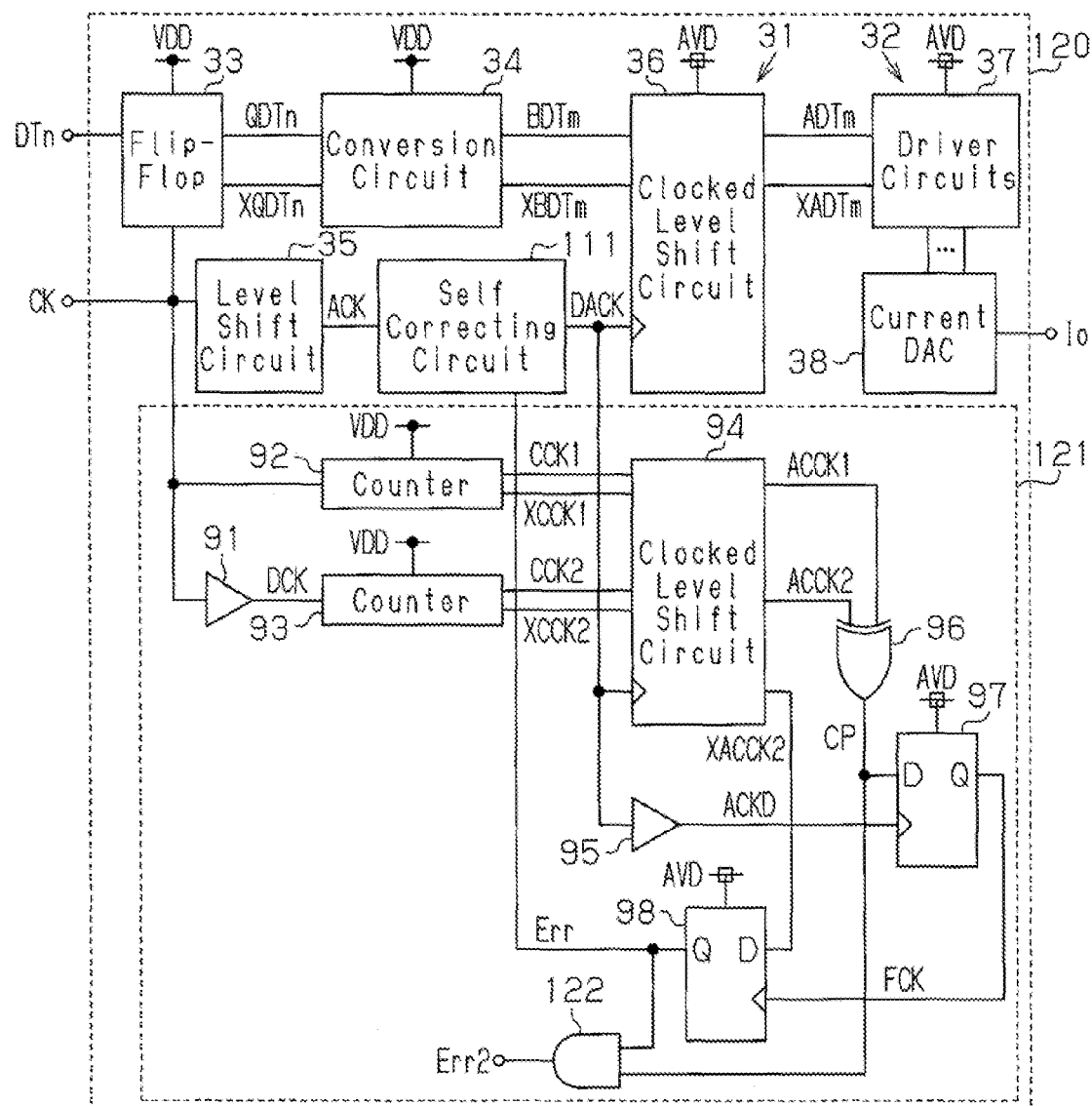
FIG. 18 is a block circuit diagram of a D/A conversion circuit of a fourth embodiment.

As illustrated in FIG. 18, a digital-to-analog conversion circuit (DAC circuit) 120 includes the level shift circuit 31, the analog circuit 32, the self correcting circuit 111, and a detection circuit 121.

The detection circuit 121 includes an AND circuit 122 in addition to the structure of the detection circuit 81 illustrated in FIG. 10. The AND circuit 122 is supplied with the error signal Err and the detection signal CP. The AND circuit 122 calculates an AND of the error signal Err and the detection signal CP and generates a second error signal Err2 in accordance with the level of the calculation result. The AND circuit 122 is an example of a calculation circuit.

Figure 19:
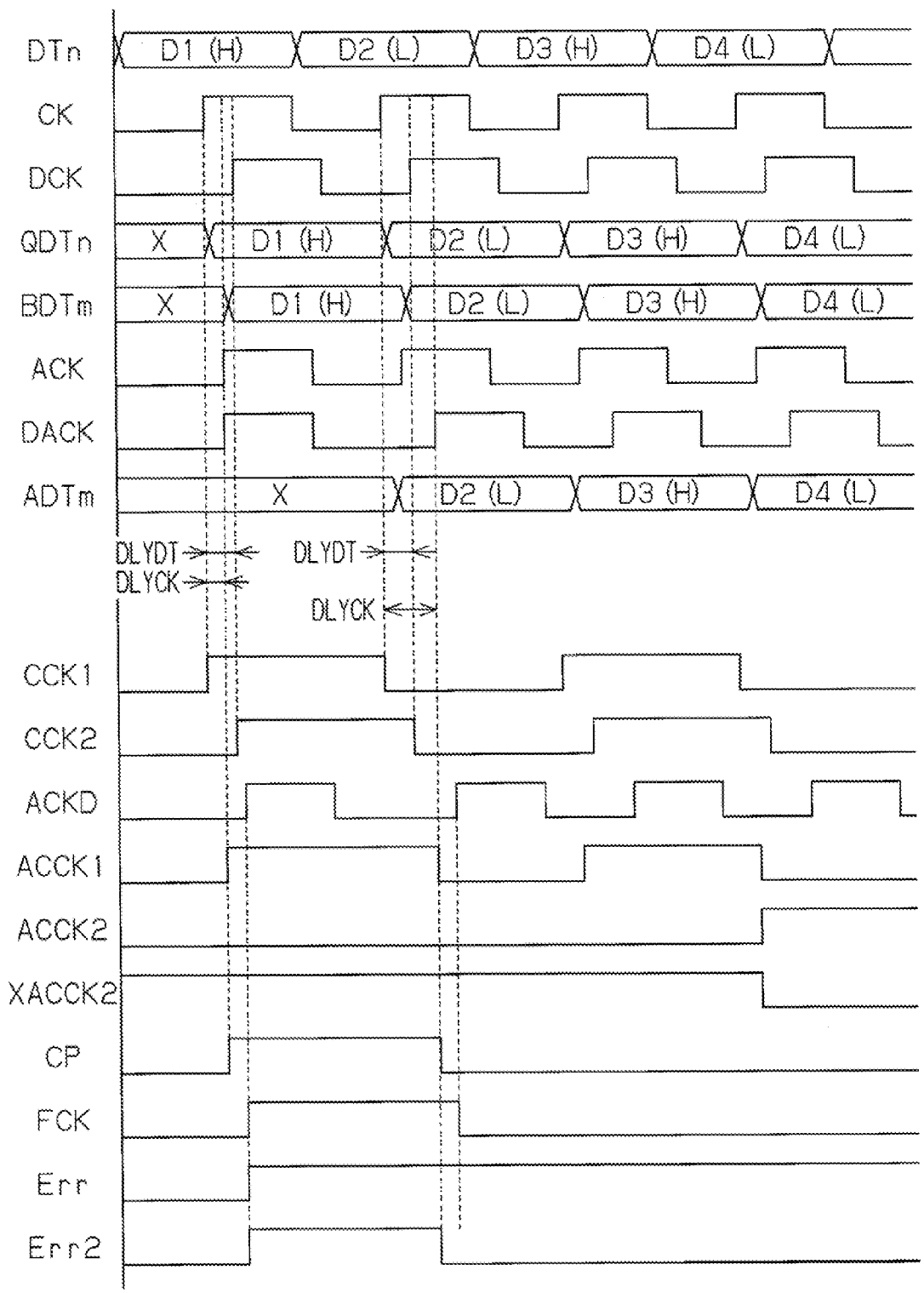
FIG. 19 is a timing chart illustrating the operation of the fourth embodiment.

As described in the above third embodiment, when a timing error occurs, the FF circuit 97 illustrated in FIG. 18 outputs the signal FCK at the H level as illustrated in FIG. 19. The FF circuit 98 thereupon outputs the first error signal Err at the H level in response to the signal FCK at the H level. The AND circuit 122 outputs the second error signal Err2 at the H level based on the detection signal CP at the H level and the first error signal Err at the H level.

The self correcting circuit 111 extends the delay time of the circuit itself in response to the first error signal Err at the H level. In other words, the self correcting circuit 111 extends the delay time of the delay clock signal DACK. When a timing error is solved by the timing of the delay clock signal DACK, the FF circuit 97 then latches the detection signal CP at the L level to output the signal FCK at the L level. The FF circuit 98 then continues to output the error signal Err at the H level.

The AND circuit 122 outputs the second error signal Err2 at the L level based on the detection signal CP at the L level and the first error signal Err at the H level. Namely, the second error signal Err2 changes to the H level when the detection circuit 121 detects a timing error, and changes to the L level when the self correcting circuit 111 solves the timing error. Although it is not illustrated, when the self correcting circuit 111 does not solve the timing error, the detection signal CP does not change to the L level. In this case, the AND circuit 122 continues to output the second error signal Err2 at the H level.

Accordingly, the test device may determine, based on the second error signal Err2, whether or not a timing error has occurred. Furthermore, the test device may determine, based on the second error signal Err2, whether or not the timing error has been solved.

The level conversion circuit of the fourth embodiment has the following advantage.

(1) The AND circuit 122 performs a logic operation on the detection signal CP and the error signal Err to generate the second error signal Err2. When a timing error is solved by the self correcting circuit 111, the EOR circuit 96 outputs the detection signal CP at the L level. Thus, the second error signal Err2 changes to the L level. Accordingly, the detection of a change in the level of the second error signal Err2 allows for the determination as to whether or not a timing error has occurred and the timing error that occurred has been solved.

Fifth Embodiment

Figure 20:
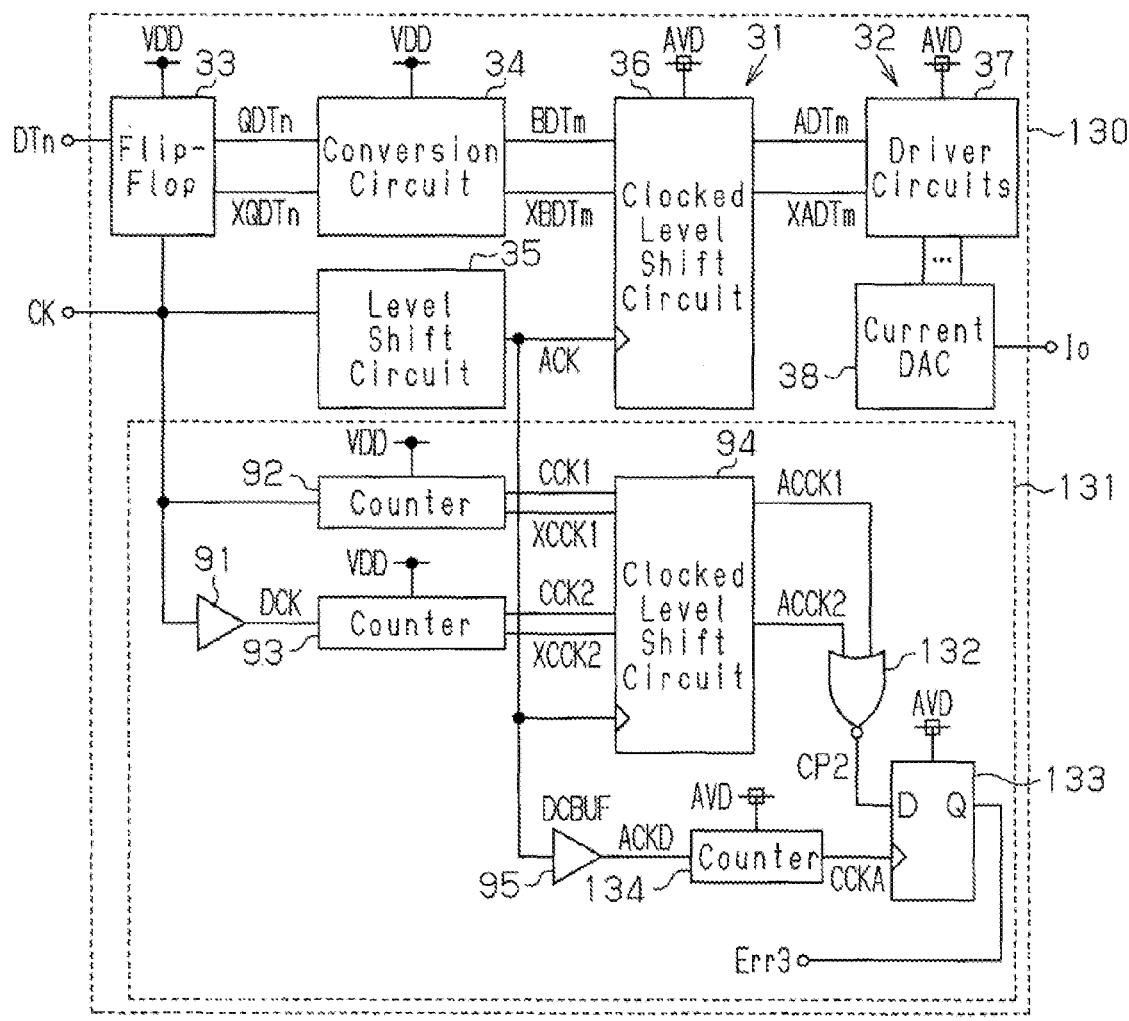
FIG. 20 is a block circuit diagram of a D/A conversion circuit of a fifth embodiment.

As illustrated in FIG. 20, a digital-to-analog conversion circuit (DAC circuit) 130 includes the level shift circuit 31, the analog circuit 32, and a detection circuit 131.

The detection circuit 131 monitors that the total value of the data delay DLYDT and one cycle of the clock signal CK (clock signal ACK) (1/fCK where fCK is the frequency of the clock signal CK) is larger than the clock delay DLYCK (DLYCK<1/fCK+DLYDT). Based on the monitoring result, when there is no timing error, the detection circuit 131 generates an error signal Err3, for example, at the L level. When there is a timing error occurs, the detection circuit 131 then generates the error signal Err3 at the H level.

The detection circuit 131 includes the buffer circuit 91, the counters 92 and 93, the clocked level shift circuit (CLS circuit) 94, the buffer circuit 95, a NOR circuit 132, a flip-flop circuit (FF circuit) 133, and a counter 134. The circuits 91 to 95 have structures similar to those in the second embodiment, descriptions thereof will be omitted.

The NOR circuit 132 is supplied with the signals ACCK1 and ACCK2 output from the CLS circuit 94. The NOR circuit 132 is supplied with the second high potential voltage AVD as the operation voltage. The NOR circuit 132 calculates a NOR of the signals ACCK1 and ACCK2 and generates a detection signal CP2 having a level in accordance with the calculation result. The NOR circuit 132 is an example of a calculation circuit. The detection signal CP2 is supplied to the flip-flop circuit (FF circuit) 133.

The delay clock signal ACKD output from the buffer circuit 95 is supplied to the counter 134. The counter 134 is supplied with the second high potential voltage AVD as the operation voltage. The counter 134 counts the delay clock signal ACKD to generate a clock signal CCKA. The clock signal CCKA repeats the inversion at every edge (rising edge, for example) of the delay clock signal ACKD. In other words, the counter 134 divides the frequency of the delay clock signal ACKD by two (divide-by-two) to generate the signal CCKA. The counter 134 is an example of a third frequency dividing circuit.

The FF circuit 133 is supplied with the second high potential voltage AVD as the operation voltage. The FF circuit 133 latches the detection signal CP2 in response to the signal CCKA at the H level and outputs the error signal Err3 having the latched level.

The operation of the detection circuit 131 configured as above will be described.

Figure 21:
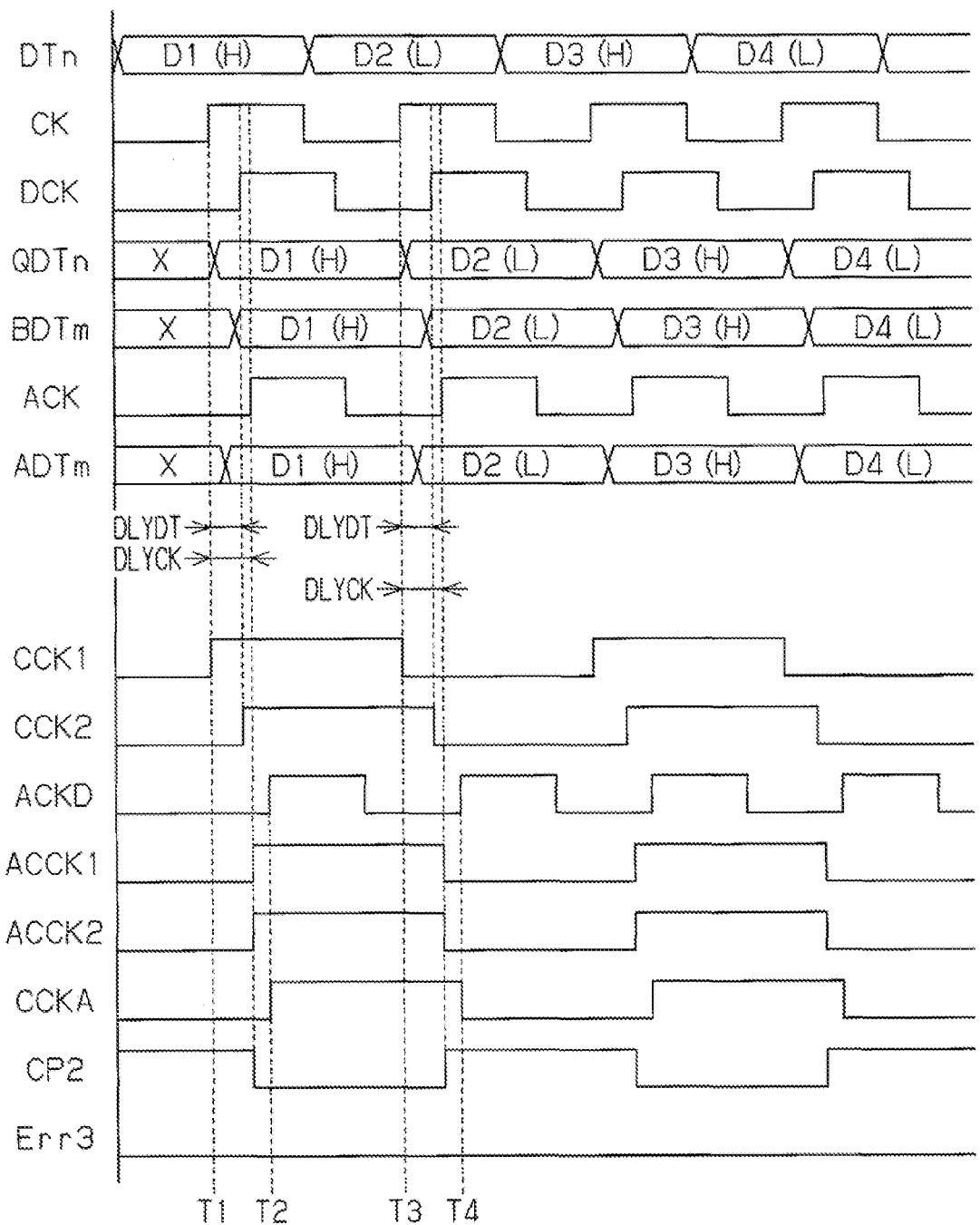
FIG. 21 is a timing chart illustrating the operation of the fifth embodiment.

As illustrated in FIG. 21, when the clock signal CK changes from the L level to the H level at a time T1, the signal CCK1 changes to the H level. Next, when the delay clock signal DCK changes from the L level to the H level, the signal CCK2 changes to the H level.

Next, after a lapse of the clock delay DLYCK from a rising timing of the clock signal CK, the clock signal ACK changes from the L level to the H level. As a result, both of the signals ACCK1 and ACCK2 change to the H level. Therefore, the NOR circuit 132 illustrated in FIG. 20 outputs the detection signal CP2 at the L level.

Next, when the delay clock signal ACKD changes from the L level to the H level at a time T2, the signal CCKA changes from the L level to the H level. Therefore, the FF circuit 133 illustrated in FIG. 20 latches the detection signal CP2. Since the detection signal CP2 is at the L level at this time, the FF circuit 133 outputs the error signal Err3 at the L level.

Next, when the clock signal CK changes from the L level to the H level at a time T3, the signal CCK1 changes to the L level. Next, when the delay clock signal DCK changes from the L level to the H level, the signal CCK2 changes to the L level.

After a lapse of the clock delay DLYCK from a rising timing of the clock signal CK, the clock signal ACK changes from the L level to the H level. As a result, both of the signals ACCK1 and ACCK2 change to the L level. The detection signal CP2 thereupon changes to the H level.

Next, when the delay clock signal ACKD changes from the L level to the H level at a time T4, the signal CCKA changes from the H level to the L level. At this time, the FF circuit 133 does not perform the latch operation on the detection signal CP2. Therefore, the error signal Err3 is maintained at the L level.

Next, after a lapse of a time corresponding to two cycles of the clock signal CK from the time T1, the signals CCK1 and CCK2 return to the initial states. In this manner, the above operations are repeated at every two cycles of the clock signal CK. With a timing design such as the above, an error signal Err4 is then maintained at the L level.

Figure 22:
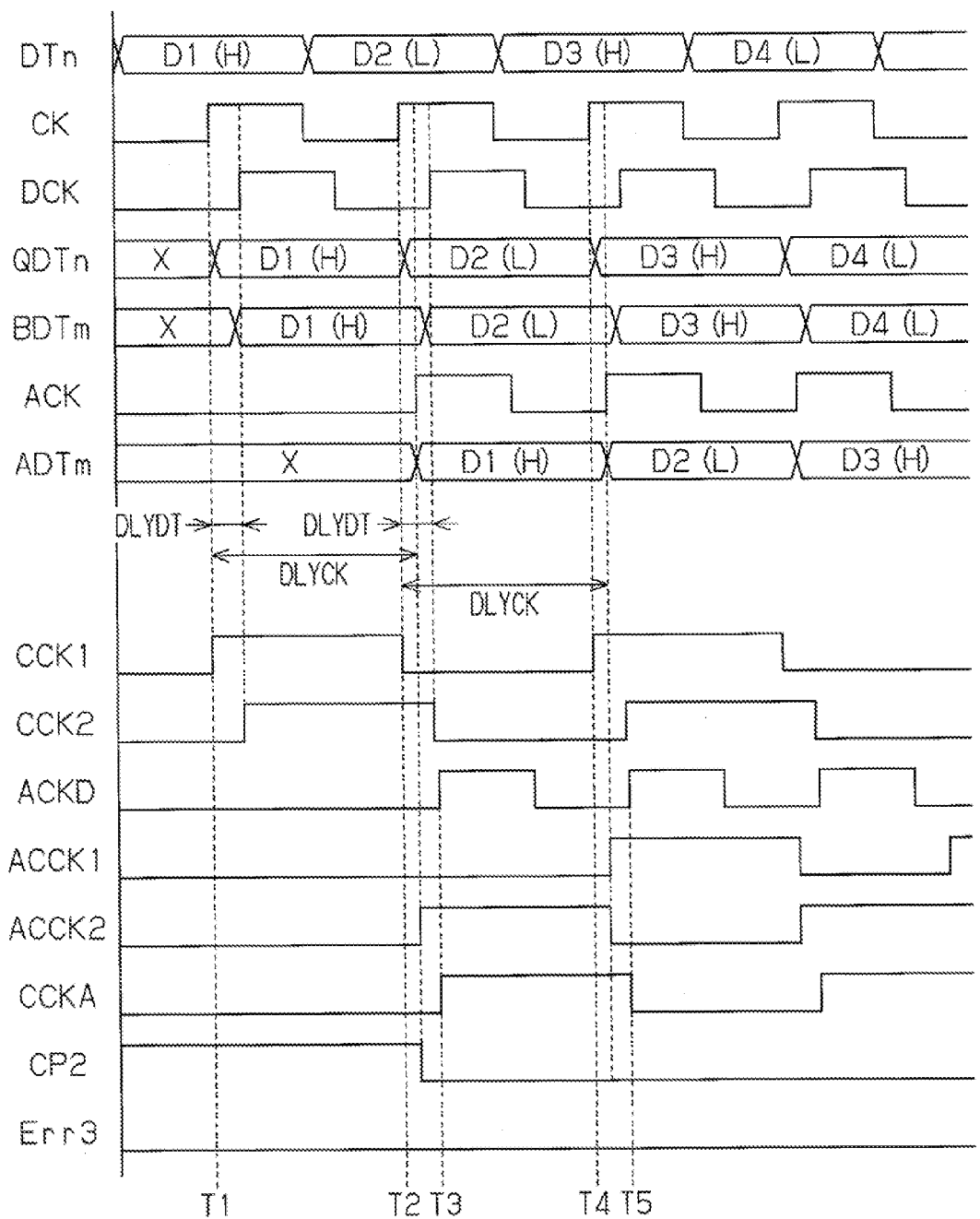
FIG. 22 is a timing chart illustrating the operation of the fifth embodiment.

As illustrated in FIG. 22, when the clock signal CK changes from the L level to the H level at a time T1, the signal CCK1 changes to the H level. Next, when the delay clock signal DCK changes from the L level to the H level, the signal CCK2 changes to the H level. Next, when the clock signal CK changes from the L level to the H level at a time T2, the signal CCK1 changes to the L level.

Next, after a lapse of the clock delay DLYCK from a rising timing of the clock signal CK at the time T1, the clock signal ACK changes from the L level to the H level. As a result, the signal ACCK1 is maintained at the L level, and the signal ACCK2 changes to the H level. The detection signal CP2 thereupon changes to the L level. Next, when the delay clock signal DCK changes from the L level to the H level, the signal CCK2 changes to the L level.

Next, when the delay clock signal ACKD changes from the L level to the H level at a time T3, the signal CCKA changes from the L level to the H level, and the FF circuit 133 latches the detection signal CP2. Since the detection signal CP2 is at the L level at this time, the FF circuit 133 outputs the error signal Err3 at the L level. As a result, the error signal Err3 does not change and is thus maintained at the L level.

Next, when the clock signal CK changes from the L level to the H level at a time T4, the signal CCK1 changes to the H level.

Next, after a lapse of the clock delay DLYCK from a rising timing of the clock signal CK at the time T2, the clock signal ACK changes from the L level to the H level. As a result, the signal ACCK1 changes to the H level, and the signal ACCK2 changes to the L level. Therefore, the detection signal CP2 is maintained at the L level.

Next, when the delay clock signal ACKD changes from the L level to the H level at a time T5, the signal CCKA changes from the H level to the L level. Therefore, the FF circuit 133 illustrated in FIG. 20 does not perform a latch operation. Accordingly, the error signal Err3 is maintained at the L level.

After a lapse of a time corresponding to three cycles of the clock signal CK from the time T1, the signals CCK1 and CCK2 return to the initial states. With a timing design such as the above, the error signal Err3 is then maintained at the L level. Namely, a timing error does not occur.

Figure 23:
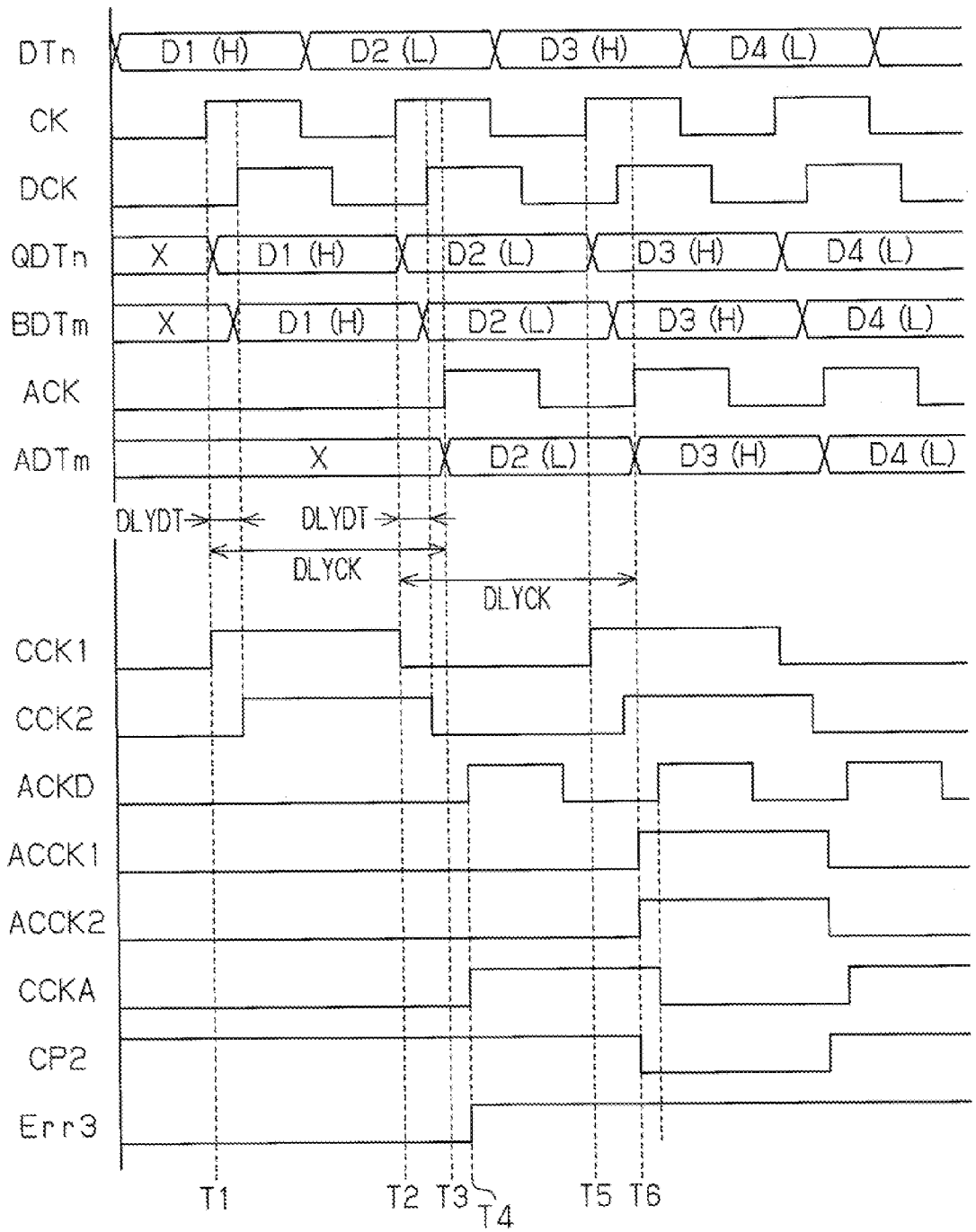
FIG. 23 is a timing chart illustrating the operation of the fifth embodiment.

As illustrated in FIG. 23, when the clock signal CK changes from the L level to the H level at a time T1, the signal CCK1 changes to the H level. Next, when the delay clock signal DCK changes from the L level to the H level, the signal CCK2 changes to the H level. Next, when the clock signal CK changes from the L level to the H level at a time T2, the signal CCK1 changes to the L level. Next, when the delay clock signal DCK changes from the L level to the H level, the signal CCK2 changes to the L level.

Next, after a lapse of the clock delay DLYCK from a rising timing of the clock signal CK at the time T1, the clock signal ACK changes from the L level to the H level (time T3). As a result, the signal ACCK1 is maintained at the L level, and the signal ACCK2 is also maintained at the L level. Therefore, the NOR circuit 132 illustrated in FIG. 20 outputs the detection signal CP2 at the H level.

Next, when the delay clock signal ACKD changes from the L level to the H level at a time T4, the signal CCKA changes from the L level to the H level. The FF circuit 133 illustrated in FIG. 20 thereupon latches the detection signal CP2 in response to the signal CCKA at the H level. Since the detection signal CP2 is at the H level at this time, the FF circuit 133 changes the error signal Err3 from the L level to the H level.

Next, after a time corresponding to a cycle of the clock signal CK elapses from the time T2, and the clock signal CK changes from the L level to the H level, the signal CCK1 changes to the H level (time T5). Next, when the delay clock signal DCK changes from the L level to the H level, the signal CCK2 changes to the H level.

Next, after a lapse of the clock delay DLYCK from a rising timing of the clock signal CK at the time T2, the clock signal ACK changes from the L level to the H level (time T6). As a result, the signal ACCK1 changes to the H level, and the signal ACCK2 also changes to the H level. Therefore, the detection signal CP2 changes to the L level.

Next, when the delay clock signal ACKD changes from the L level to the H level, the signal CCKA changes from the H level to the L level. Since the FF circuit 133 does not perform the latch operation at this time, the error signal Err3 is maintained at the H level.

The level conversion circuit of the fifth embodiment has the following advantages.

(1) The detection circuit 131 detects the operation timings of the flip-flop circuit 33 and the CLS circuit 36 and generates the error signal Err3 in accordance with the detection result. Thus, the use of the error signal Err3 allows for the detection of an error in the operation timings of the flip-flop circuit 33 and the CLS circuit 36.

(2) The detection circuit 81 includes the buffer circuit 91. The buffer circuit 91 adds to the clock signal CK a delay time in relation to the signal transmission path from the flip-flop circuit 33 to the CLS circuit 36 to generate the delay clock signal DCK. The CLS circuit 94 converts the frequency-divided signal CCK1 of the clock signal CK and the frequency-divided signal CCK2 of the delay clock signal DCK from the level of the first high potential voltage VDD to the level of the second high potential voltage AVD in response to the second clock signal ACK to generate the first and second shifted frequency-divided signals ACCK1 and ACCK2.

The first and second shifted frequency-divided signals ACCK1 and ACCK2 change in accordance with the relationship in length between the data delay time DLYDT and the clock delay DLYCK. When the clock delay DLYCK is longer than the data delay DLYDT (DLYDT<DLYCK) within a cycle of the clock signal CK, the levels of both the signals ACCK1 and ACCK2 change in the similar phase (refer to FIG. 21). On the other hand, when the data delay DLYDT is longer than the clock delay DLYCK (DLYDT>DLYCK) within a cycle of the clock signal CK, the levels of both the signals ACCK1 and ACCK2 change in the opposite phase.

The NOR circuit 132 calculates a NOR of both the signals ACCK1 and ACCK2 to generate the detection signal CP2. The FF circuit 133 then latches the detection signal CP2 in response to the frequency-divided signal CCKA of the second delay clock signal ACKD. Thus, the detection of changes in the levels of the signals ACCK1 and ACCK2 allows for the monitoring of the condition (DLYDT<DLYCK) for the operation of the level shift circuit 31.

Further, when the clock delay DLYCK is smaller than the total value of a cycle of the clock signal CK and the data delay DLYDT (DLYCK<1/fCK+DLYDT), the FF circuit 133 latches the detection signal CP2 at the L level to output the error signal Err3 at the L level (refer to FIG. 22). On the other hand, when the clock delay DLYCK is larger than the total value of a cycle of the clock signal CK and the data delay DLYDT (DLYCK>1/fCK+DLYDT), the FF circuit 133 latches the detection signal CP2 at the H level to output the error signal Err3 at the H level (refer to FIG. 23). In this manner, the detection circuit 131 monitors the condition (DLYCK<1/fCK+DLYDT) for the operation of the level shift circuit 31 and generates the error signal Err3 in accordance with the monitoring result.

Sixth Embodiment

Figure 24:
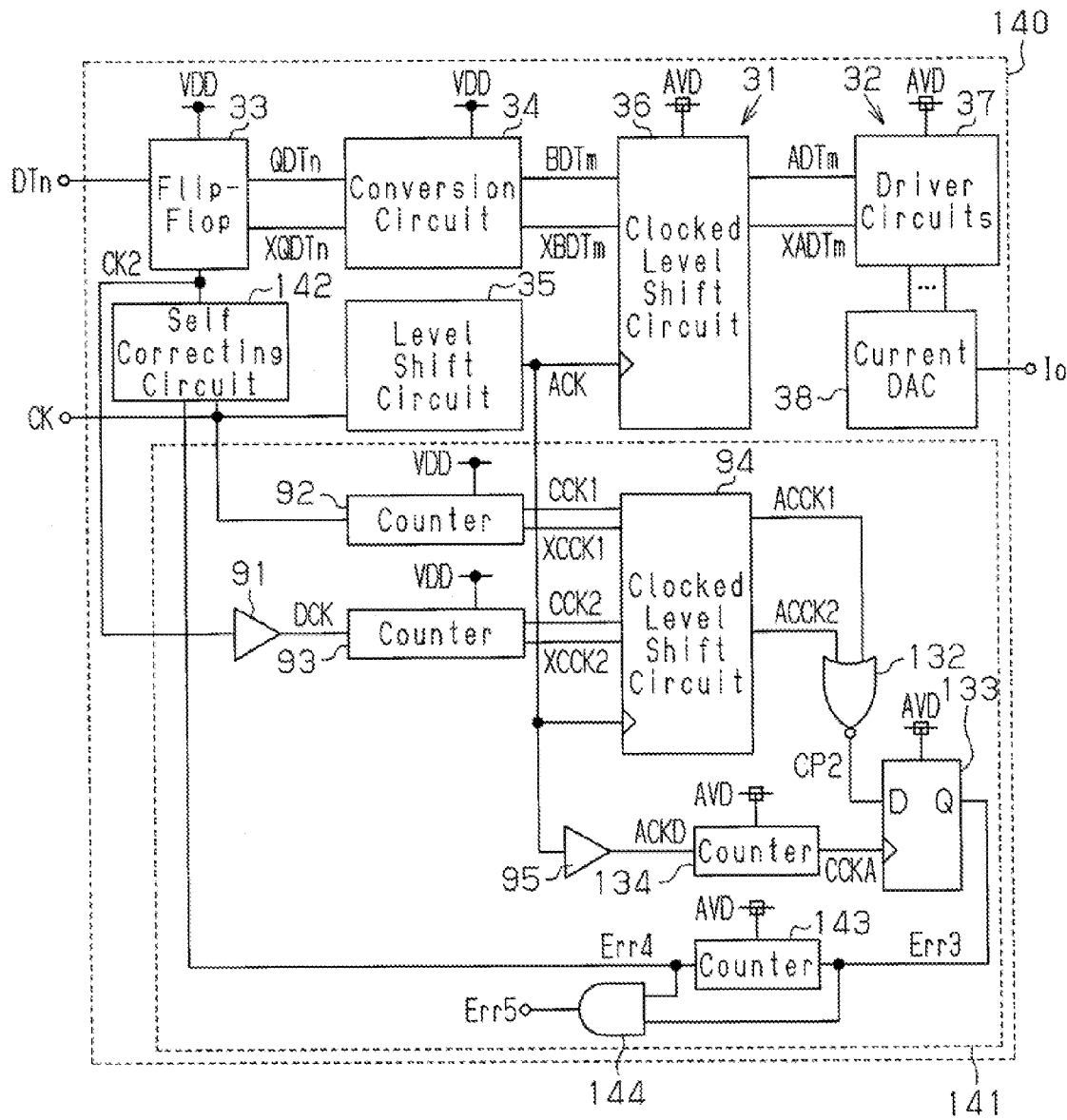
FIG. 24 is a block circuit diagram of a D/A conversion circuit of a sixth embodiment.

As illustrated in FIG. 24, a digital-to-analog conversion circuit (DAC circuit) 140 includes the level shift circuit 31, the analog circuit 32, a detection circuit 141 and a self correcting circuit 142.

The detection circuit 141 includes a counter 143 and an AND circuit 144 in addition to the structure of the detection circuit 131 illustrated in FIG. 20. The counter 143 is supplied with the error signal Err3 output from the FF circuit 133. The counter 143 is supplied with the second high potential voltage AVD as the operation voltage. The counter 143 counts the third error signal Err3 to output a fourth error signal Err4. The error signal Err4 repeats the inversion at every edge (rising edge, for example) of the error signal Err3. In other words, the counter 143 divides the frequency of the error signal Err3 by two (divide-by-two) to generate the error signal Err4. The counter 143 is an example of a fourth frequency dividing circuit.

The AND circuit 144 is supplied with the third error signal Err3 and the fourth error signal Err4. The AND circuit 144 calculates an AND of the third error signal Err3 and the fourth error signal Err4 and generates a fifth error signal Err5 in accordance with the level of the calculation result. The AND circuit 144 is an example of a calculation circuit.

The fourth error signal Err4 is supplied to the self correcting circuit 142. The self correcting circuit 142 has a similar structure to that of the self correcting circuit 111 in the third embodiment. The self correcting circuit 142 adds a delay time in accordance with the fourth error signal Err4 to the clock signal CK to generate a clock signal CK2. The clock signal CK2 is supplied to the buffer circuit 91 and the flip-flop circuit 33. The buffer circuit 91 delays the clock signal CK2 to generate the delay clock signal DCK.

The flip-flop circuit 33 latches the data signal DTn in response to the clock signal CK2. The self correcting circuit 142 adjusts the timing when the flip-flop circuit 33 receives the data signal DTn.

The fifth error signal Err5 is similar to the second error signal Err2 in the fourth embodiment. The fifth error signal Err5 changes to the H level when the detection circuit 141 detects a timing error, and changes to the L level when the self correcting circuit 142 solves the timing error. Although it is not illustrated, when the self correcting circuit 142 does not solve the timing error, the error signal Err3 does not change to the L level. Thus, the AND circuit 144 continues to output the fifth error signal Err5 at the H level.

Accordingly, the test device may determine, based on the fifth error signal Err5, whether or not a timing error has occurred. Furthermore, the test device may determine, based on the fifth error signal Err5, whether or not the timing error that occurred has been solved.

The operation of the detection circuit 141 and the self correcting circuit 142 configured as above will be described.

Figure 25:
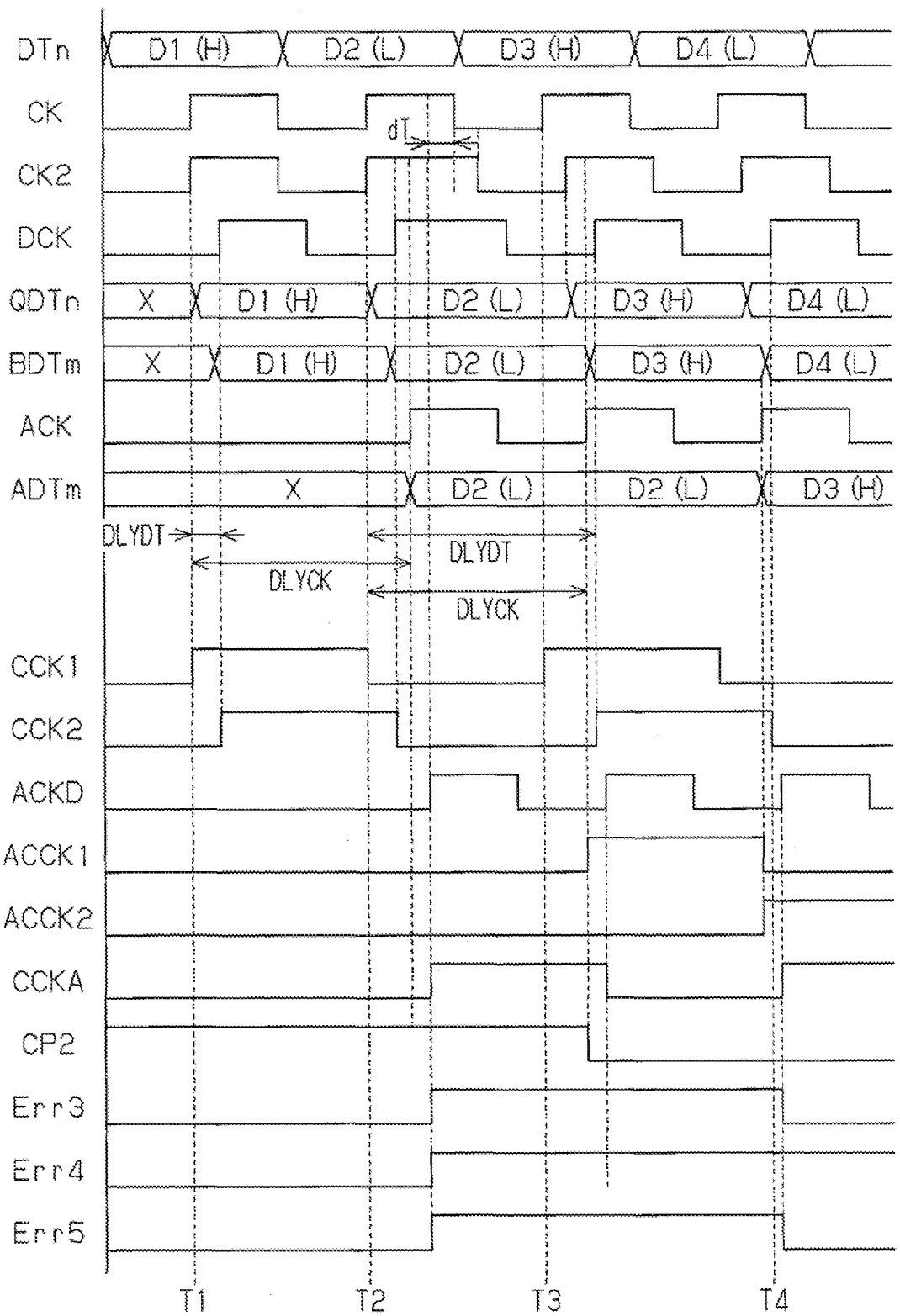
FIG. 25 is a timing chart illustrating the operation of the sixth embodiment.

As illustrated in FIG. 25, when the clock signal CK changes from the L level to the H level at a time T1, the signal CCK1 changes to the H level. Next, when the delay clock signal DCK changes from the L level to the H level, the signal CCK2 changes to the H level. When the clock signal CK subsequently changes from the L level to the H level at a time T2, the signal CCK1 changes to the L level. Next, when the delay clock signal DCK changes from the L level to the H level, the signal CCK2 changes to the L level.

After a lapse of the clock delay DLYCK from a rising timing of the clock signal CK at the time T1, the clock signal ACK changes from the L level to the H level. As a result, the signal ACCK1 is maintained at the L level, and the signal ACCK2 is also maintained at the L level. Therefore, the detection signal CP2 is maintained at the H level.

Next, when the delay clock signal ACKD changes from the L level to the H level, the signal CCKA changes from the L level to the H level. The FF circuit 133 illustrated in FIG. 24 latches the detection signal CP2 in response to the signal CCKA at the H level. Since the detection signal CP2 is at the H level at this time, the third error signal Err3 changes to the H level. As a result, the fourth error signal Err4 changes to the H level. Further, since the third and fourth error signals Err3 and Err4 are at the H level, the fifth error signal Err5 changes to the H level. Therefore, the occurrence of a timing error is found.

When the error signal Err4 changes to the H level, the self correcting circuit 142 extends a delay time of the clock signal CK2 relative to the clock signal CK by a time dT illustrated in FIG. 25. As a result, the timing when the FF circuit 33 captures the data signal DTn is delayed. In other words, the data delay DLYDT becomes longer.

Next, when the clock signal CK changes from the L level to the H level at a time T3, the signal CCK1 changes to the H level. Next, when the clock signal ACK changes from the L level to the H level, the signal ACCK1 changes to the H level. Since the signal ACCK2 is at the L level at this time, the detection signal CP2 changes to the L level.

Next, when the delay clock signal DCK changes from the L level to the H level, the signal CCK2 changes to the H level.

Next, when the delay clock signal ACKD changes from the L level to the H level, the signal CCKA changes from the H level to the L level. Therefore, the FF circuit 133 does not perform the latch operation. Accordingly, the error signal Err3 is maintained at the H level.

Next, when the clock signal ACK changes from the L level to the H level at a time T4, the CLS circuit 36 outputs the signal ADTm corresponding to the data D3. In this manner, the level shift circuit 31 operates at a normal operation timing.

When the delay clock signal ACKD changes from the L level to the H level afterward, the signal CCKA changes from the L level to the H level. The FF circuit 133 latches the detection signal CP2 in response to the signal CCKA at the H level, and outputs the error signal Err3 at the L level.

Since the third error signal Err3 is at the L level and the fourth error signal Err4 is at the H level, the fifth error signal Err5 changes to the L level. Thus, it is determined from a change in the fifth error signal Err5 whether or not the timing error has been improved.

Although the signal CCKA repeats the inversion afterward, the detection signal CP2 is maintained at the L level. Accordingly, the third error signal Err3 is maintained at the L level, the fourth and fifth error signals Err4 and Err5 do not change.

The level conversion circuit of the sixth embodiment has the following advantages.

(1) The detection circuit 141 monitors the condition (DLYCK<1/fCK+DLYDT) for the operation of the level shift circuit 31.

(2) The detection circuit 141 generates the third error signal Err3 in accordance with the monitoring result. The self correcting circuit 142 receives the fourth error signal Err4 obtained from the third error signal Err3. When a timing error occurs, the self correcting circuit 142 extends a delay of the clock signal CK2. Accordingly, the self correcting circuit 142 operates in a manner of solving the timing error.

(3) The AND circuit 144 calculates an AND of the third and fourth error signals Err3 and Err4 and generates the fifth error signal Err5. When a timing error is detected, the fifth error signal Err5 changes to a given level (for example, the H level). When the self correcting circuit 142 solves the timing error, the fifth error signal Err5 changes to the L level. Thus, the detection of a change in the level of the fifth error signal Err5 allows for the determination as to whether or not a timing error has occurred and the timing error has been solved.

Seventh Embodiment

Figure 26:
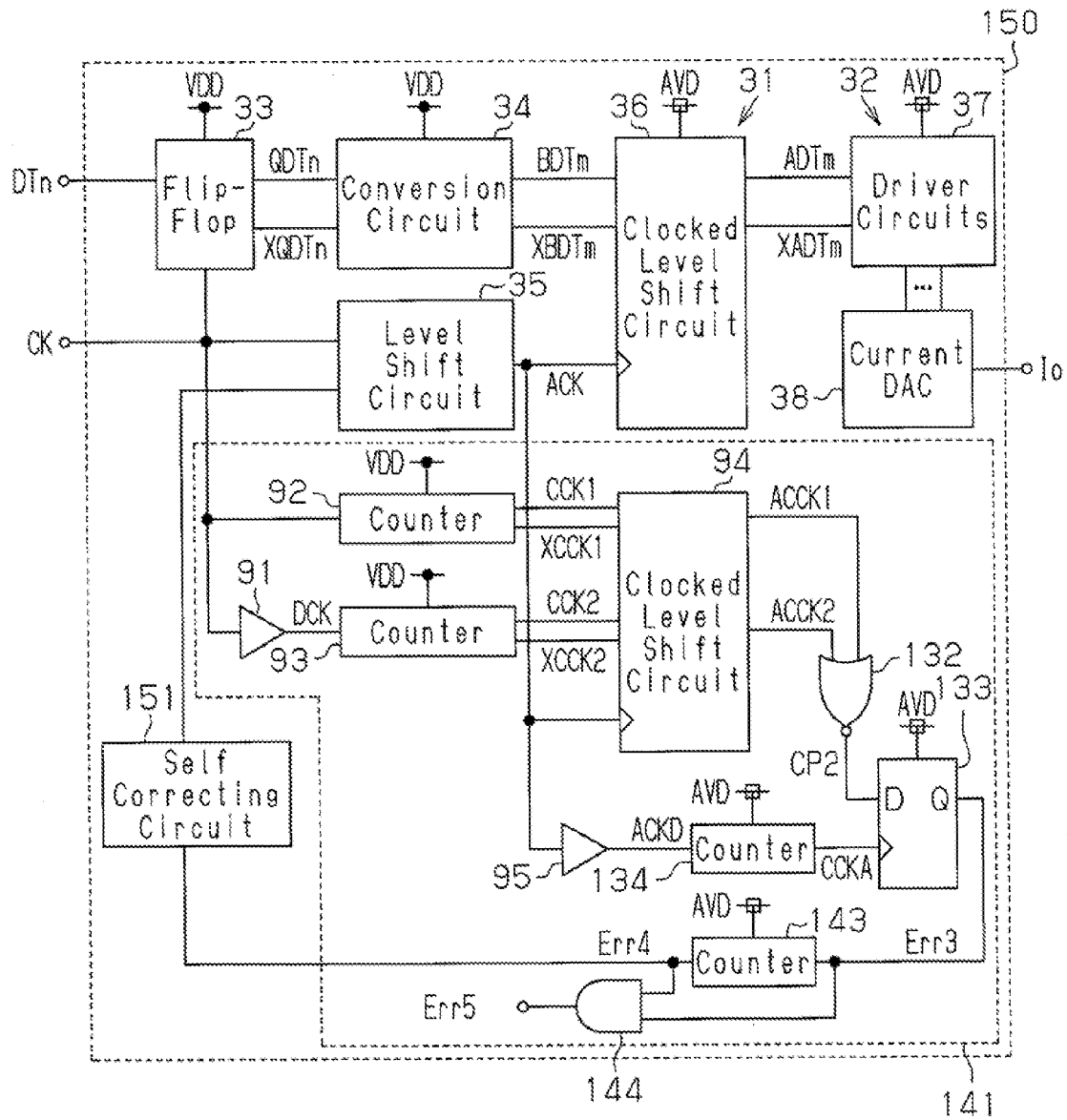
FIG. 26 is a block circuit diagram of a D/A conversion circuit of a seventh embodiment.

As illustrated in FIG. 26, a digital-to-analog conversion circuit (DAC circuit) 150 includes the level shift circuit 31, the analog circuit 32, the detection circuit 141, and a self correcting circuit 151.

The self correcting circuit 151 is supplied with the fourth error signal Err4. The self correcting circuit 151 adjusts the clock delay DLYCK in response to the fourth error signal Err4. The fourth error signal Err4 is at the L level when there is no timing error in the level shift circuit 31, and changes to the H level when a timing error occurs. When the fourth error signal Err4 is at the H level, the self correcting circuit 151 shortens the clock delay DLYCK as compared when the error signal Err4 is at the L level. As a result, the data delay DLYDT becomes relatively longer, and the timing error is solved.

Figure 27:
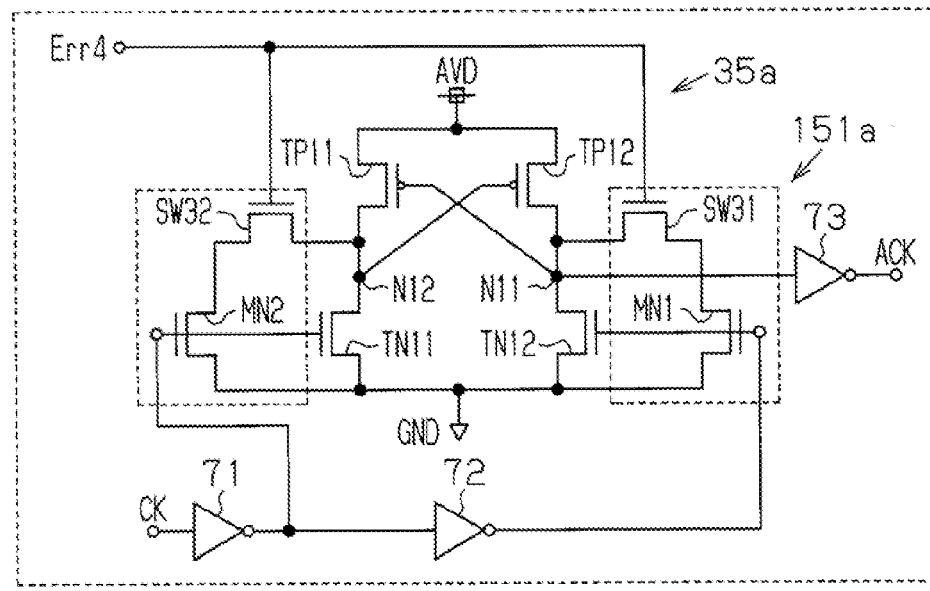
FIG. 27 is a circuit diagram of a self correcting circuit.

FIG. 27 illustrates a first example of the structure of the self correcting circuit 151.

This self correcting circuit 151*a* is applied to the level shift circuit 35*a* illustrated in FIG. 6. As illustrated in FIG. 27, the self correcting circuit 151*a* includes switches SW31 and SW32 and N-channel MOS transistors MN1 and MN2. The switches SW31 and SW32 are formed by high withstanding voltage N-channel MOS transistors. The transistors MN1 and MN2 are high withstanding voltage N-channel MOS transistors.

The switch SW31 includes a first terminal coupled to the node N11 and a second terminal coupled to a drain of the transistor MN1. A source of the transistor MN1 is supplied with the low potential voltage GND. Further, a gate of the transistor MN1 is supplied with the output signal (input signal XIN) of the inverter circuit 72. The switch SW32 includes a first terminal coupled to the node N12 and a second terminal coupled to a drain of the transistor MN2. A source of the transistor MN2 is supplied with the low potential voltage GND. Further, a gate of the transistor MN2 is supplied with the output signal (input signal IN) of the inverter circuit 71. Control terminals of the switches SW31 and SW32 (gates of the transistors) are supplied with the fourth error signal Err4.

The switches SW31 and SW32 are turned on in response to the error signal Err4 at the H level, and are turned off in response to the error signal Err4 at the L level. The switch SW31, which has been turned on, couples the transistor MN1 to the N-channel MOS transistor TN12 of the level shift circuit 35*a* in parallel. Similarly, the switch SW32, which has been turned on, couples the transistor MN2 to the N-channel MOS transistor TN11 of the level shift circuit 35*a* in parallel.

According to this structure, the amount of current flowing from the node N11 or N12 to a wiring supplied with the low potential voltage GND increases as compared with the case where the transistors MN1 and MN2 are not coupled. The potentials at the nodes N11 and N12 thereupon change more quickly. As a result, the clock signal ACK being the output signal of the level shift circuit 35*a* rises or falls more quickly. This shortens the clock delay DLYCK.

Figure 28:
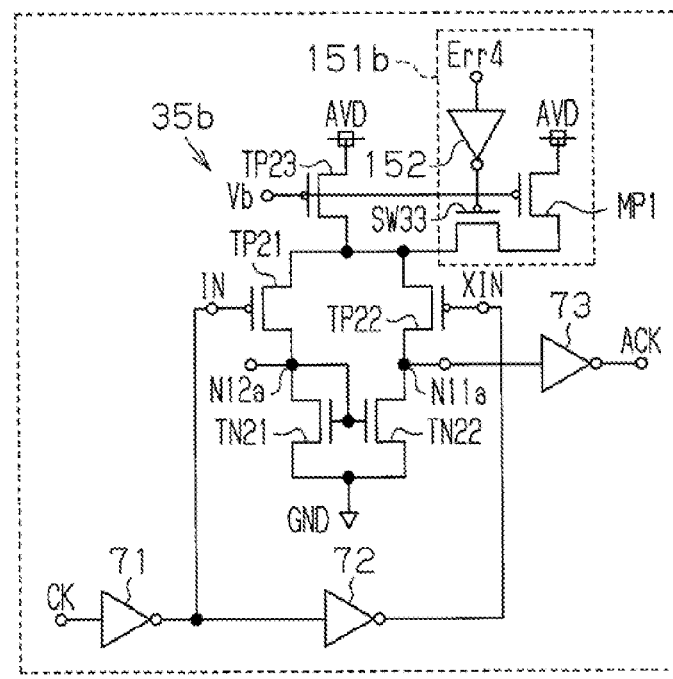
FIG. 28 is a circuit diagram of a self correcting circuit.

FIG. 28 illustrates a second example of the structure of the self correcting circuit.

This self correcting circuit 151*b* is applied to the level shift circuit 35*b* illustrated in FIG. 7. As illustrated in FIG. 28, the self correcting circuit 151*b* includes a transistor MP1, a switch SW33, and an inverter circuit 152. The transistor MP1 is a high withstanding voltage P-channel MOS transistor. The switch SW33 is formed by a high withstanding voltage P-channel MOS transistor.

A source of the transistor MP1 is supplied with the second high potential voltage AVD. A drain of the transistor MP1 is coupled to a drain of the transistor TP23 via the switch SW33. A gate of the transistor MP1 is supplied with the bias voltage Vb. The inverter circuit 152 is supplied with the error signal Err4. An output signal of the inverter circuit 152 is supplied to a control terminal of the switch SW33 (a gate of the transistor).

The switch SW33 is turned on by the error signal Err4 at the H level and is turned off by the error signal Err4 at the L level. The switch SW33, which has been turned on, couples the transistor MP1 to the transistor TP23 of the level shift circuit 35*b* in parallel.

According to this structure, the amount of current supplied to the transistors TP21 and TP22 via the transistors TP23 and MP1 thereupon increases as compared with the case where the transistor MP1 is not coupled. The potentials at the nodes N11*a* and N12*a* thereupon change more quickly. As a result, the clock signal ACK being the output signal of the level shift circuit 35*b* rises or falls more quickly. This shortens the clock delay DLYCK.

The operation of the self correcting circuit 151 configured as above will be described.

Figure 29:
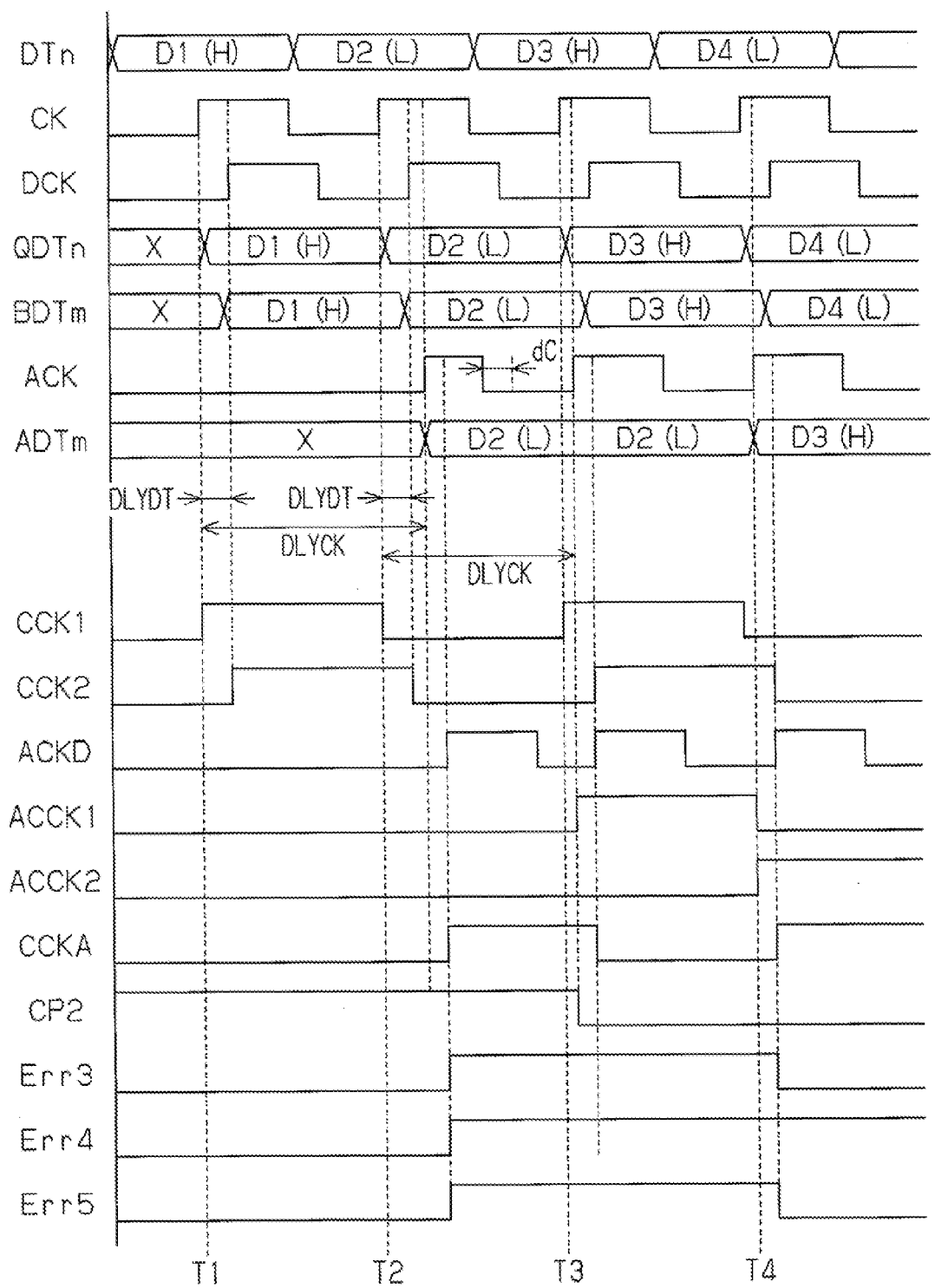
FIG. 29 is a timing chart illustrating the operation of the seventh embodiment.

As illustrated in FIG. 29, when the clock signal CK changes from the L level to the H level at a time T1, the signal CCK1 changes to the H level.

Next, when the delay clock signal DCK changes from the L level to the H level, the signal CCK2 changes to the H level.

Next, when the clock signal CK changes from the L level to the H level at a time T2, the signal CCK1 changes to the L level. Next, when the delay clock signal DCK changes from the L level to the H level, the signal CCK2 changes to the L level.

After a lapse of the clock delay DLYCK from a rising timing of the clock signal CK at the time T1, the clock signal ACK changes from the L level to the H level. As a result, the signal ACCK1 is maintained at the L level, and the signal ACCK2 is also maintained at the L level. Therefore, the detection signal CP2 is maintained at the H level.

Next, when the delay clock signal ACKD changes from the L level to the H level, the signal CCKA changes from the L level to the H level. The FF circuit 133 illustrated in FIG. 26 latches the detection signal CP2 in response to the signal CCKA at the H level. Since the detection signal CP2 is at the H level at this time, the FF circuit 133 outputs the third error signal Err3 at the H level. Therefore, the fourth error signal Err4 changes to the H level.

Further, since the third and fourth error signals Err3 and Err4 are at the H level, the fifth error signal Err5 changes to the H level. The occurrence of a timing error is found by a change to the H level in the fifth error signal Err5.

When the fourth error signal Err4 changes to the H level, the self correcting circuit 151 shortens a delay time by dC. Accordingly, the clock signal ACK quickens. In other words, the clock delay DLYCK is shortened. As a result, the timing when the CLS circuit 36 illustrated in FIG. 26 captures data quickens.

Next, when the clock signal CK changes from the L level to the H level at a time T3, the signal CCK1 changes to the H level. Next, when the clock signal ACK changes from the L level to the H level, the signal ACCK1 changes to the H level. Since the signal ACCK2 is at the L level at this time, the detection signal CP2 changes to the L level.

Next, when the delay clock signal DCK changes from the L level to the H level, the signal CCK2 changes to the H level.

Next, when the delay clock signal ACKD changes from the L level to the H level, the signal CCKA changes from the H level to the L level. However, the error signal Err3 of the FF circuit 133 stays at the H level.

Next, when the clock signal ACK changes from the L level to the H level at a time T4, the CLS circuit 36 outputs the signal ADTm corresponding to the data D3. In this manner, the level shift circuit 31 operates at a normal operation timing.

Afterward, when the delay clock signal ACKD changes from the L level to the H level, the signal CCKA changes from the L level to the H level. The FF circuit 133 latches the detection signal CP2 in response to the signal CCKA at the H level and outputs the error signal Err3 at the L level.

Since the third error signal Err3 is at the L level and the fourth error signal Err4 is at the H level, the fifth error signal Err5 changes to the L level. An improvement in the timing error is found by a change to the L level in the fifth error signal Err5.

Although the signal CCKA repeats the inversion afterward, the detection signal CP2 is maintained at the L level. Accordingly, the third error signal Err3 is maintained at the L level, and the fourth and fifth error signals Err4 and Err5 do not change.

The level conversion circuit of the seventh embodiment has the following advantage.

(1) The self correcting circuit 151 corrects the operation timing of the level shift circuit 35 in response to the error signal Err4. When a timing error occurs, the self correcting circuit 151 quickens the operation speed of the level shift circuit 35 as compared with the case where there is no timing error. As a result, since the clock delay DLYCK is shortened, the operation timing of the level shift circuit 31 is corrected.

It should be apparent to those skilled in the art that the aforementioned embodiments may be embodied in many other forms without departing from the spirit or scope of the invention. Particularly, it should be understood that the aforementioned embodiments may be embodied in the following forms.

In the above embodiments, the description was given assuming the DAC circuit as an analog circuit. However, the analog circuit may be an analog-to-digital conversion circuit (ADC circuit) and the like. For example, in the case of an ADC circuit, the conversion circuit 34 is set to be an encoder. In this manner, the structure of the conversion circuit 34 may be changed in accordance with the type of the analog circuit.

In the above embodiments, the structure of the latch circuit 421 is not limited to that illustrated in FIG. 5 as long as the latch circuit 421 holds a signal in the comparative period during the reset period. For example, the outputs of the NAND circuits 63 and 64 (including two AND circuits and two inverter circuits) may be used as the signals ADT1 and XADT1. In this case, the inverter circuits 65 and 66 may be eliminated. Alternatively, instead of the structure illustrated in FIG. 5, a latch circuit may be formed by NOR circuits.

Figure 30:
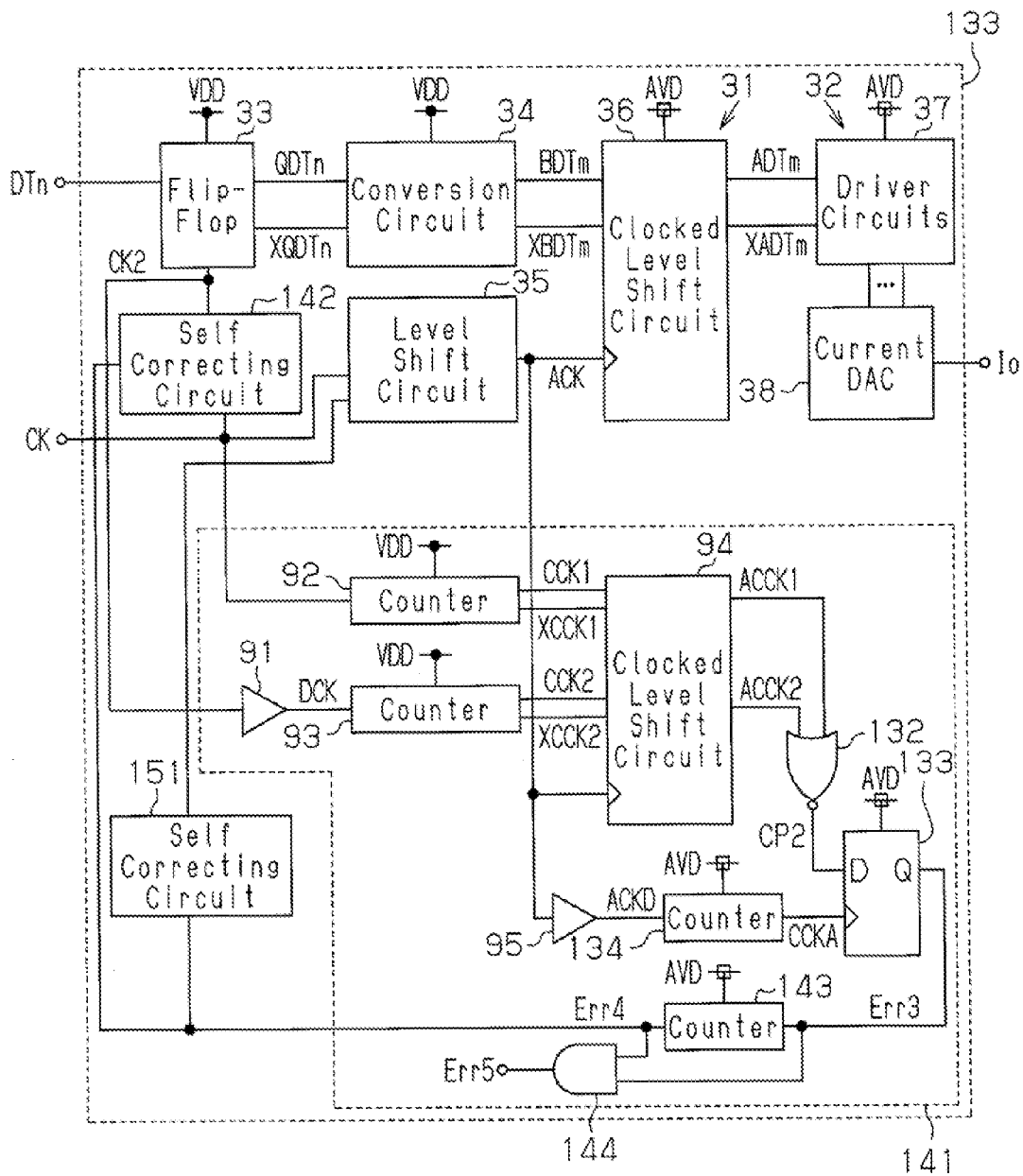
FIG. 30 is a block circuit diagram of another D/A conversion circuit.

The above embodiments may be combined as appropriate. For example, as illustrated in FIG. 30, a level conversion circuit (DAC circuit 160) may include the detection circuit 141 illustrated in FIG. 24, the self correcting circuit 142 illustrated in FIG. 24, and the self correcting circuit 151 illustrated in FIG. 26. The self correcting circuit 142 delays the latch timing of the FF circuit 33. The self correcting circuit 151 quickens the timing when the CLS circuit 36 transits from the reset state to the comparative state. Accordingly, the operation timing of the level shift circuit 31 is adjusted in a wider range. This may solve a timing error easily.

Figure 31:
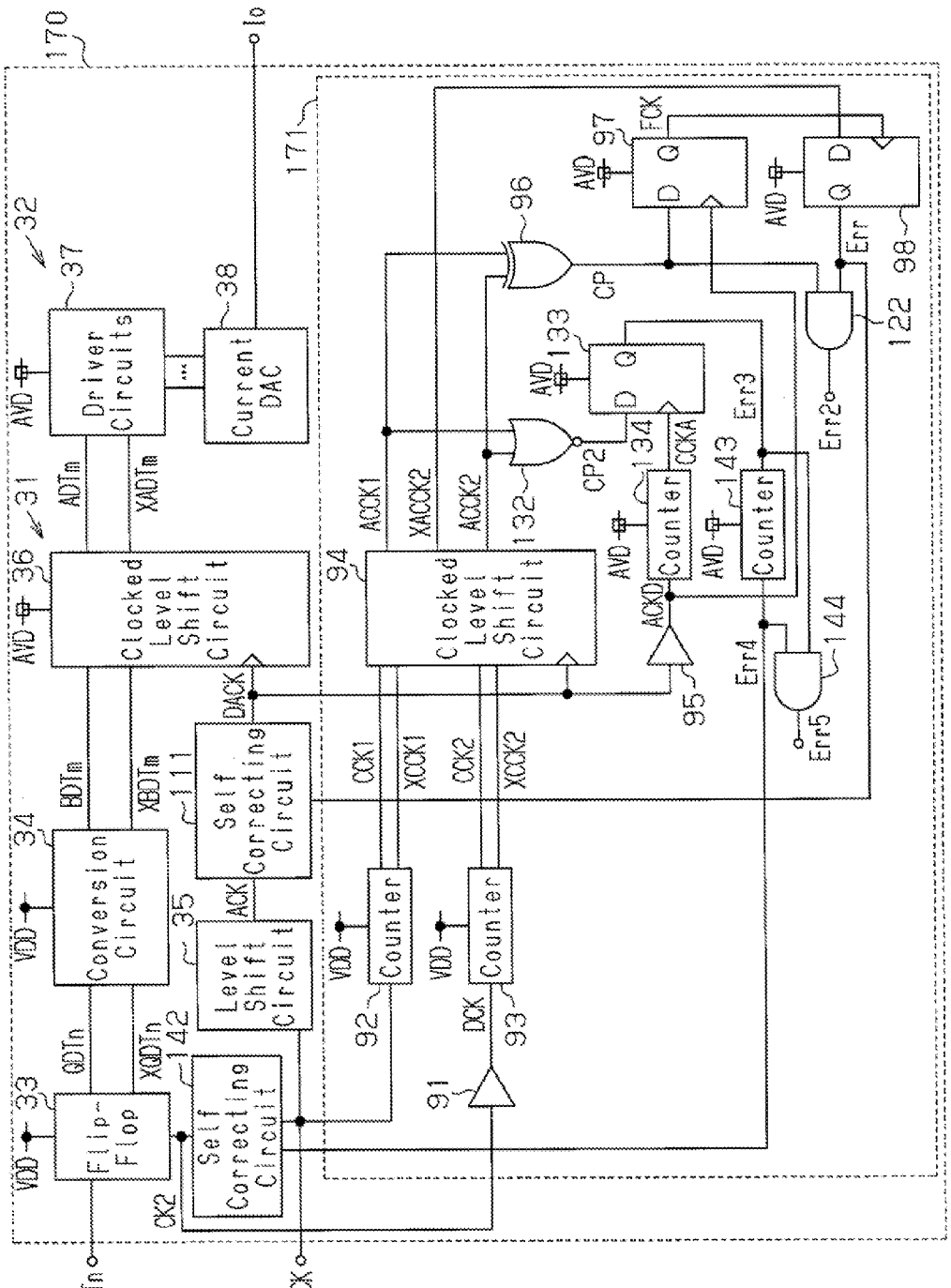
FIG. 31 is a block circuit diagram of another D/A conversion circuit.
Figure 32:
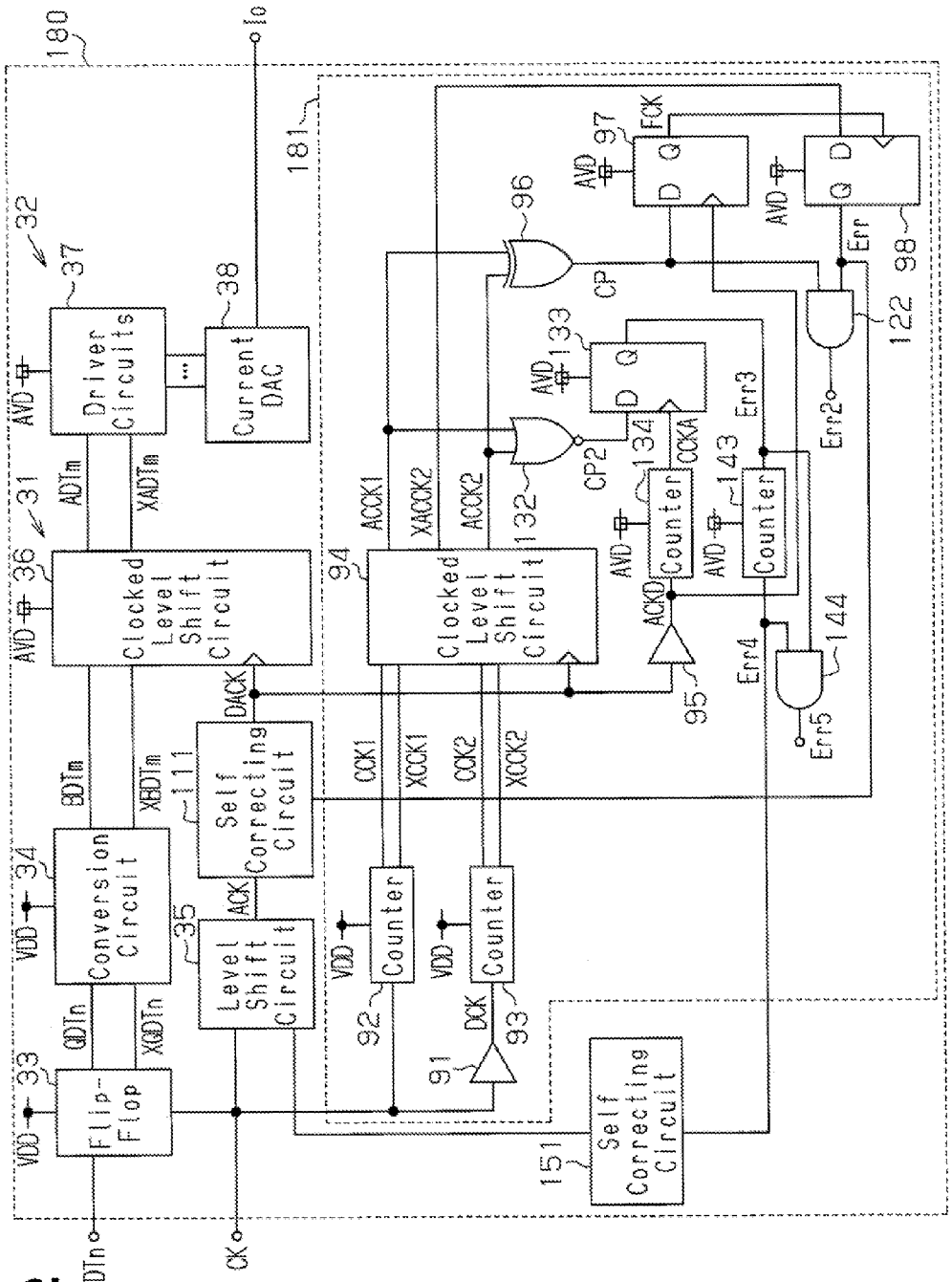
FIG. 32 is a block circuit diagram of another D/A conversion circuit.
Figure 33:
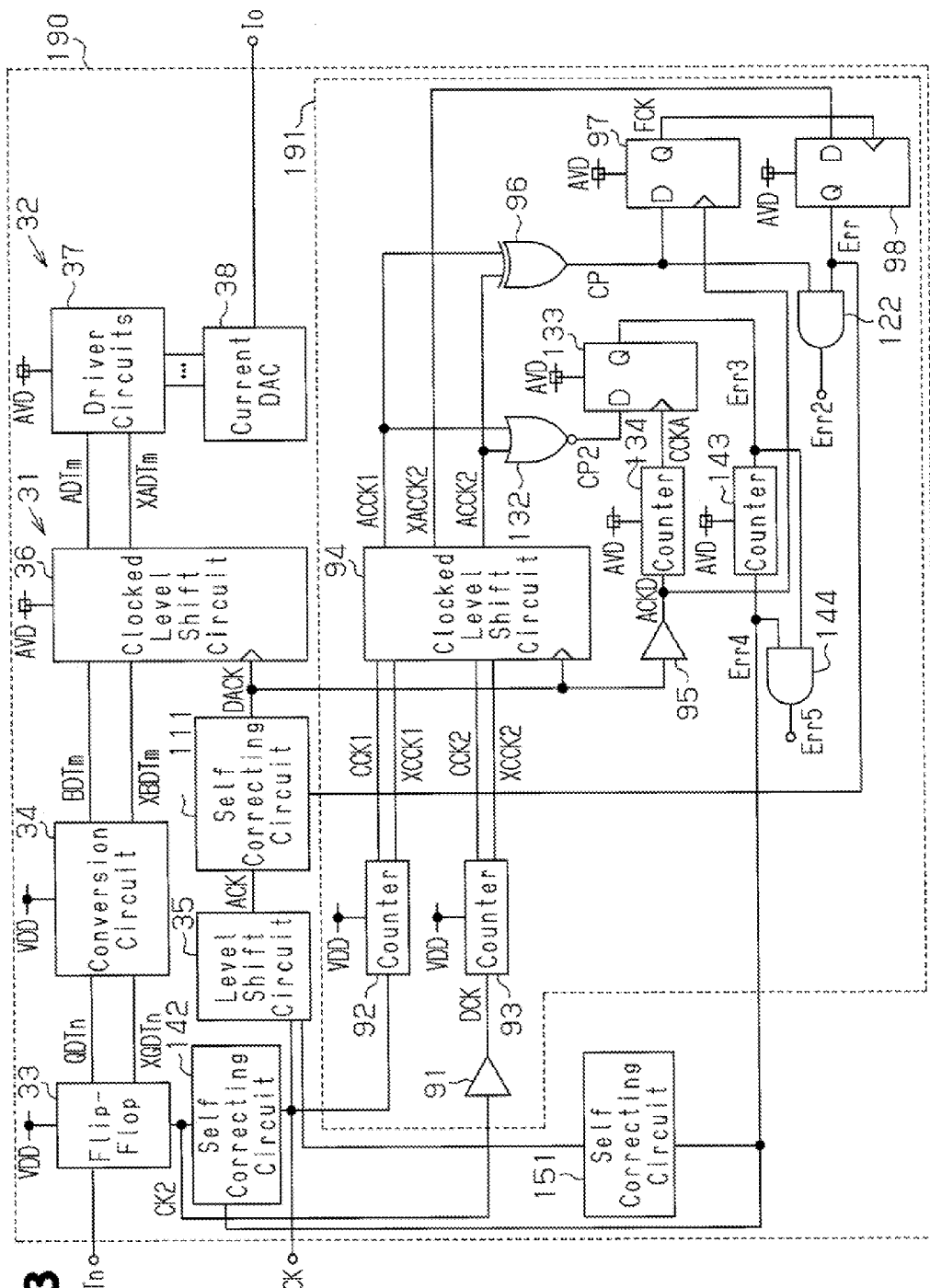
FIG. 33 is a block circuit diagram of another D/A conversion circuit.

Further, as illustrated in FIG. 31, a level conversion circuit (DAC circuit 170) may include a detection circuit 171, which is configured by combining the detection circuit 121 illustrated in FIG. 18 and the detection circuit 141 illustrated in FIG. 24, the self correcting circuit 111 illustrated in FIG. 18, and the self correcting circuit 142 illustrated in FIG. 24. Further, as illustrated in FIG. 32, a level conversion circuit (DAC circuit 180) may include a detection circuit 181, which is configured by combining the detection circuit 121 illustrated in FIG. 18 and the detection circuit 141 illustrated in FIG. 24, the self correcting circuit 111 illustrated in FIG. 18, and the self correcting circuit 151 illustrated in FIG. 26. Further, as illustrated in FIG. 33, a level conversion circuit (DAC circuit 190) may include a detection circuit 191, which is configured by combining the detection circuit 121 illustrated in FIG. 18 and the detection circuit 141 illustrated in FIG. 24, the self correcting circuit 111 illustrated in FIG. 18, the self correcting circuit 142 illustrated in FIG. 24, and the self correcting circuit 151 illustrated in FIG. 26. Any of the detection circuits 171, 181, and 191 monitors the above two conditions (DLYDT<DLYCK, DLYCK<1/fCK+DLYDT). The self correcting circuits 111, 142, and 151 operate in a manner of solving timing errors in accordance with the monitoring results.

The level shift circuit 35a illustrated in FIG. 6 uses the inverter circuits 71 and 72 to generate the complementary input signals IN and XIN based on the clock signal CK. Here, when the complementary input signals IN and XIN are supplied to the level shift circuit 35a, the inverter circuits 71 and 72 may be eliminated. Further, the level shift circuit 35a may generate complementary output signals. In this case, an inverter circuit having an input terminal coupled to the node N12 may be added. With this structure, the added inverter circuit outputs an inverted signal of the signal ACK output from the inverter circuit 73.

Similarly, when the complementary input signals IN and XIN are supplied to the level shift circuit 35b illustrated in FIG. 7, the inverter circuits 71 and 72 may be eliminated. Further, the level shift circuit 35b may generate complementary output signals. In this case, an inverter circuit having an input terminal coupled to the node N12a may be added. With this structure, the added inverter circuit outputs an inverted signal of the signal ACK output from the inverter circuit 73.

In FIG. 5, each of the DC circuits 41$_1$ to 41$m$ is designed to include the inverter circuit 51. However, the number of inverter circuits 51 may be one for a plurality of DC circuits. For example, m number of DC circuits may share a single inverter circuit 51. This promotes a reduction in footprint.

In the above embodiments, the DC circuits 41$_1$ to 41$m$ are designed to be supplied with the complementary signals BDT1 and XBDT1 to BDTm and XBDTm, respectively.

However, the DC circuits 411 to 41m may be supplied with not such complementary signals but the signals BDT1 to BDTm, respectively. In this case, for example, any one of the transistors TP3 and TP4, which are illustrated in FIG. 5, may be supplied with a given voltage (for example, an intermediate voltage between the first high potential voltage VDD and the low potential voltage GND).

According to the above-mentioned embodiments, an area of the level conversion circuit is reduced.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

The invention claimed is:

1. A level conversion circuit comprising:
    a first conversion circuit that converts a first clock signal based on a signal level of a first voltage into a second clock signal based on a signal level of a second voltage;
    a flip-flop circuit supplied with the first voltage as an operation voltage, wherein the flip-flop circuit latches and outputs a signal, which is based on the signal level of the first voltage, in accordance with the first clock signal; and
    a second conversion circuit including
        a converter supplied with the second voltage as an operation voltage and supplied with the second clock signal, wherein the converter converts a signal level of an input signal, which is based on an output signal of the flip-flop circuit, into the signal level of the second voltage in synchronization with the second clock signal, and
        a latch circuit that latches the signal level of the second voltage.

2. The level conversion circuit according to claim 1, wherein:
    the converter repeats alternately a first operation state and a second operation state in accordance with the second clock signal, wherein
        when the converter is in the first operation state, the converter converts the input signal, which is based on the signal level of the first voltage, into a first signal, which is based on the signal level of the second voltage, and
        when the converter is in the second operation state, the converter generates the first signal at a reset level; and
    the latch circuit latches the first signal of the converter, wherein the latch circuit generates a signal according to a level of the latched first signal in the first operation state of the converter, and maintains a level of the latched first signal based on the first signal of the reset level in the second operation state of the converter.

3. The level conversion circuit according to claim 2, wherein the converter includes:
    first and second P-channel MOS transistors, each including a gate that receives one of complementary signals, a source, and a drain;
    a third P-channel MOS transistor including a gate that receives an inverted clock signal of the second clock signal, a source supplied with the second voltage, and a drain coupled to the sources of the first and second P-channel MOS transistors;
    a pair of inverter circuits cross-coupled and including power supply terminals coupled to the drains of the first and second P-channel MOS transistors, respectively, wherein the pair of inverter circuits generate the first signal based on the signal level of the second voltage; and
    a plurality of N-channel MOS transistors, each including a gate that receives the inverted clock signal, wherein the plurality of N-channel MOS transistors couple and decouple, to and from a wiring supplied with a reset voltage, output terminals of the pair of inverter circuits and the power supply terminals.

4. The level conversion circuit according to claim 2, wherein the latch circuit includes:
    first and second inverter circuits that receive complementary signals output from the converter, respectively;
    first and second AND circuits that are cross-coupled and receive output signals of the first and second inverter circuits, respectively; and
    third and fourth inverter circuits that receive output signals of the first and second AND circuits, respectively.

5. The level conversion circuit according to claim 3, wherein the second conversion circuit includes:
    at least one inverter circuit that logically inverts the second clock signal to generate the inverted clock signal; and
    converters provided in a number corresponding to the number of bits of the complementary signals.

6. The level conversion circuit according to claim 1, wherein the flip-flop circuit latches n-bit input signals (n is positive number) to output n-bit signals, the level conversion circuit comprising:
    a third conversion circuit supplied with the first voltage as an operation voltage, the third conversion circuit converting the n-bit signals output from the flip-flop circuit into m-bit signals (m is positive number), the m-bit signals being based on the signal level of the first voltage, wherein
    the second conversion circuit converts levels of the m-bit signals generated by the third conversion circuit into the signal level of the second voltage.

7. The level conversion circuit according to claim 6, wherein:
    the third conversion circuit converts the n-bit signals output from the flip-flop circuit into the m-bit signals and m-bit inverted signals; and
    the second conversion circuit compares the m-bit signals with the m-bit inverted signals, respectively, to generate complementary signals based on the signal level of the second voltage.

8. The level conversion circuit according to claim 1, further comprising a detection circuit that detects operation timings of the flip-flop circuit and the second conversion circuit and generates an error signal in accordance with the detection result.

9. The level conversion circuit according to claim 2, further comprising a detection circuit that detects operation timings of the flip-flop circuit and the second conversion circuit and generates an error signal in accordance with the detection result.

10. The level conversion circuit according to claim 8, wherein the detection circuit generates the error signal in accordance with a relationship in length between a first delay time of the input signal of the second conversion circuit relative to the output signal of the flip-flop circuit and a second delay time of the second clock signal relative to the first clock signal.

11. The level conversion circuit according to claim 8, wherein the detection circuit generates the error signal in accordance with a relationship in length between a total value, which is sum of a first delay time of the input signal of the second conversion circuit relative to the output signal of the flip-flop circuit and one cycle of the first clock signal, and a second delay time of the second clock signal relative to the first clock signal.

12. The level conversion circuit according to claim 8, further comprising a self correcting circuit that corrects an operation timing of at least one of the flip-flop circuit and the second conversion circuit based on the error signal.

13. The level conversion circuit according to claim 8, further comprising a first self correcting circuit that corrects a timing of the second clock signal based on the error signal to generate a corrected clock signal, wherein the second conversion circuit converts the level of the input signal into the signal level of the second voltage in synchronization with the corrected clock signal.

14. The level conversion circuit according to claim 8, further comprising a second self correcting circuit that corrects a timing of the first clock signal based on the error signal to generate a corrected clock signal, wherein the flip-flop circuit latches the signal, which is based on the signal level of the first voltage, in synchronization with the corrected clock signal.

15. The level conversion circuit according to claim 8, further comprising a third self correcting circuit that corrects an operation speed of the first conversion circuit based on the error signal.

16. The level conversion circuit according to claim 8, wherein the detection circuit includes:
a first delay circuit that delays the first clock signal by a time corresponding to a signal transmission path from the flip-flop circuit to the second conversion circuit to generate a first delay clock signal;
a first frequency dividing circuit that divides the first clock signal to generate a first frequency-divided signal;
a second frequency dividing circuit that divides the first delay clock signal to generate a second frequency-divided signal;
a first frequency-divided signal conversion circuit configured similar to that of the second conversion circuit, wherein the first frequency-divided signal conversion circuit converts the first frequency-divided signal into a first shifted frequency-divided signal, which is based on the signal level of the second voltage, in synchronization with the second clock signal;
a second frequency-divided signal conversion circuit configured similar to that of the second conversion circuit, wherein the second frequency-divided signal conversion circuit converts the second frequency-divided signal into a second shifted frequency-divided signal, which is based on the signal level of the second voltage, in synchronization with the second clock signal;
a second delay circuit that delays the second clock signal by a time corresponding to operation of the first frequency-divided signal conversion circuit to generate a second delay clock signal;
a first calculation circuit that calculates an exclusive OR of the first shifted frequency-divided signal and the second shifted frequency-divided signal to generate a detection signal;
a first flip-flop circuit that latches the detection signal in synchronization with the second delay clock signal; and
a second flip-flop circuit that latches a complementary signal of the second shifted frequency-divided signal in synchronization with an output signal of the first flip-flop circuit to generate the error signal.

17. The level conversion circuit according to claim 16, wherein the detection circuit further includes a second calculation circuit that calculates an AND of the detection signal and the error signal to generate a second error signal.

18. The level conversion circuit according to claim 8, wherein the detection circuit includes:
a first delay circuit that delays the first clock signal by a time corresponding to a signal transmission path from the flip-flop circuit to the second conversion circuit to generate a first delay clock signal;
a first frequency dividing circuit that divides the first clock signal to generate a first frequency-divided signal;
a second frequency dividing circuit that divides the first delay clock signal to generate a second frequency-divided signal;
a first frequency-divided signal conversion circuit configured similar to that of the second conversion circuit, wherein the first frequency-divided signal conversion circuit converts the first frequency-divided signal into a first shifted frequency-divided signal, which is based on the signal level of the second voltage, in synchronization with the second clock signal;
a second frequency-divided signal conversion circuit configured similar to that of the second conversion circuit, wherein the second frequency-divided signal conversion circuit converts the second frequency-divided signal into a second shifted frequency-divided signal, which is based on the signal level of the second voltage, in synchronization with the second clock signal;
a second delay circuit that delays the second clock signal by a time corresponding to operation of the first frequency-divided signal conversion circuit to generate a second delay clock signal;
a calculation circuit that calculates a NOR of the first shifted frequency-divided signal and the second shifted frequency-divided signal to generate a detection signal;
a third frequency dividing circuit that divides the second delay clock signal to generate a third frequency-divided signal; and
a flip-flop circuit that latches the detection signal in synchronization with the third frequency-divided signal to generate a third error signal.

19. The level conversion circuit according to claim 18, wherein the detection circuit further includes:
a fourth frequency dividing circuit that divides the third error signal to generate a fourth error signal; and
a logic circuit that calculates an AND of the third and fourth error signals to generate a fifth error signal.

20. A semiconductor device comprising:
a first circuit operating at a first voltage;
a second circuit operating at a second voltage different from the first voltage; and
a level conversion circuit supplied with the first and second voltages,
wherein the level conversion circuit includes:
a first conversion circuit that converts a first clock signal based on a signal level of the first voltage into a second clock signal based on a signal level of the second voltage;
a flip-flop circuit supplied with the first voltage as an operation voltage, wherein the flip-flop circuit latches and outputs a signal, which is based on the signal level of the first voltage, in accordance with the first clock signal; and a second conversion circuit including
- a converter supplied with the second voltage as an operation voltage and supplied with the second clock signal, wherein the converter converts a signal level of an input signal, which is based on an output signal of the flip-flop circuit, into the signal level of the second voltage in synchronization with the second clock signal, and
- a latch circuit that latches the signal level of the second voltage.

* * * * *